United States Patent
Sasakura

(10) Patent No.: US 7,233,266 B2
(45) Date of Patent: Jun. 19, 2007

(54) DATA COMPRESSION/DECOMPRESSION DEVICE AND DATA COMPRESSION/DECOMPRESSION METHOD

(75) Inventor: Miyoshi Sasakura, Higashiyamato (JP)

(73) Assignees: Casio Electronics Manufacturing Co., Ltd., Irum-shi (JP); Casio Computer Co., Ltd., Tokyo (JP)

( * ) Notice: Subject to any disclaimer, the term of this patent is extended or adjusted under 35 U.S.C. 154(b) by 0 days.

(21) Appl. No.: 11/313,078

(22) Filed: Dec. 20, 2005

(65) Prior Publication Data

US 2006/0139188 A1 Jun. 29, 2006

(30) Foreign Application Priority Data

Dec. 28, 2004 (JP) .............................. 2004-379814
Feb. 16, 2005 (JP) .............................. 2005-039807

(51) Int. Cl.
*H03M 7/34* (2006.01)
*H03M 7/38* (2006.01)

(52) U.S. Cl. ........................... 341/51; 341/65; 341/67; 341/106

(58) Field of Classification Search ................ 341/51, 341/65, 67
See application file for complete search history.

(56) References Cited

U.S. PATENT DOCUMENTS

| | | | |
|---|---|---|---|
| 4,626,829 A | * | 12/1986 | Hauck ........................ 341/63 |
| 4,967,196 A | * | 10/1990 | Sprague et al. ............... 341/67 |
| 5,532,694 A | * | 7/1996 | Mayers et al. ............... 341/67 |
| 5,627,534 A | | 5/1997 | Craft |

(Continued)

FOREIGN PATENT DOCUMENTS

EP 0 734 126 A1 9/1996

(Continued)

OTHER PUBLICATIONS

Franaszek, P. et al., "Parallel compression with cooperative dictionary construction" Data Compression Conference, 1996, CDD '96, Proceedings Snowbird, UT, USA Mar. 31-Apr. 3, 1996, Los Alamitos, CA USA, IEEE Comput. Soc., US, Mar. 31, 1996, pp. 200-209, XP01015561, ISBN: 0-8186-7358-3.

Benschop, L. C. et al., "100 Mbit per Second VLSI Implementation of Sliding Window Coding" Data Compression Conference, 1996, CDD '96,Proceedings Snowbird, UT, USA Mar. 31-Apr. 3, 1996, Los Alamitos, CA USA, IEEE Comput. Soc., US, Mar. 31, 1996, p. 424, XP01015588, ISBN: 0-8186-7358-3.

(Continued)

*Primary Examiner*—Khai M. Nguyen
(74) *Attorney, Agent, or Firm*—Frishauf, Holtz, Goodman & Chick, P.C.

(57) ABSTRACT

A first compression unit compresses input data by a first compression method utilizing a dictionary coding method. A second decompression unit compresses input data by a second compression method utilizing a statistical coding method. A size calculation/determination unit pre-calculates sizes of data to be output when the data is compressed only by the first compression method, when the data is compressed only by the second compression method, when the data is compressed both by the first and second compression methods, and when the data is compressed neither by the first nor the second compression method, and selects the method that will result in the smallest data size, so that the input data is compressed by the selected method.

16 Claims, 29 Drawing Sheets

U.S. PATENT DOCUMENTS

| | | |
|---|---|---|
| 5,945,933 A | 8/1999 | Kalkstein |
| 5,964,842 A | 10/1999 | Pakcard |
| 6,075,470 A | 6/2000 | Little et al. |
| 6,121,903 A | 9/2000 | Kalkstein |
| 6,311,224 B1 | 10/2001 | Packard |
| 6,411,227 B1* | 6/2002 | Fish ............................. 341/65 |
| 6,484,142 B1 | 11/2002 | Miyasaka et al. |
| 6,756,922 B2* | 6/2004 | Ossia ........................... 341/51 |
| 6,903,668 B1* | 6/2005 | Dror et al. .................... 341/67 |

FOREIGN PATENT DOCUMENTS

| | | |
|---|---|---|
| EP | 1 047 198 A2 | 10/2000 |
| JP | 3241788 B2 | 9/1993 |
| JP | 3276860 B2 | 3/1998 |
| WO | WO 99/44292 A1 | 9/1999 |

OTHER PUBLICATIONS

Randers-Pehrson, G. et al., "PNG (Portable Network Graphics) Specification, Version 1.1" IETF Standard-Working-Draft, Internet Engineering Task Force, IETF, CH, Jan. 1999, XP015034261, ISSN: 0000-0004. pp. 1-112.

Solomon D., "Data Compression: The Complete Reference" Data Compression: The Complete Reference, New York, NY : Springer, US, 1998, pp. 101-162, 357, XP002150106, ISBN: 0-387-98280-9, no month.

* cited by examiner

FIG. 3A
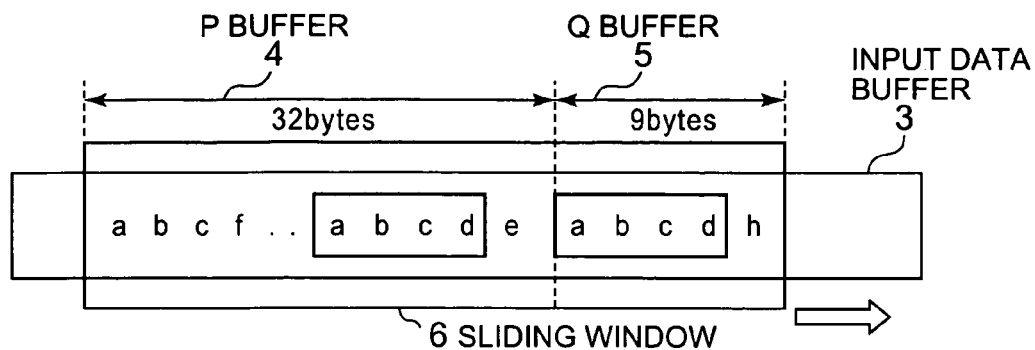
FIG. 3B
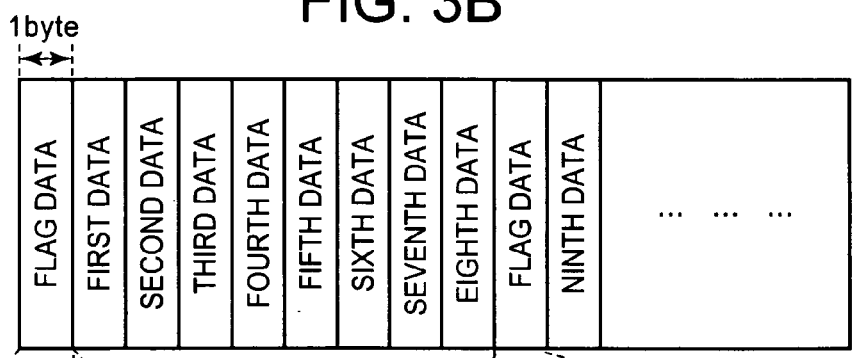
FIG. 3C
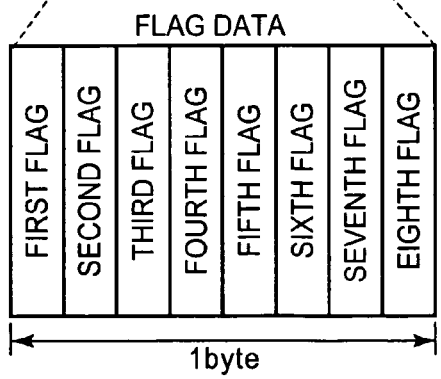
FIG. 3D
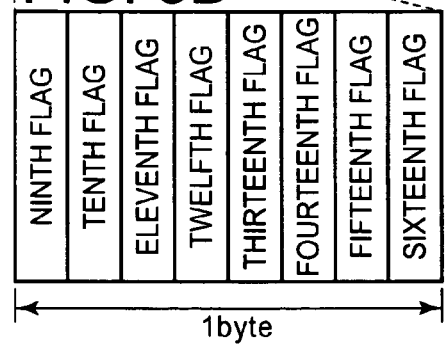
FIG. 3E
UNCOMPRESSED m-TH DATA
ORIGINAL DATA (1byte)
FIG. 3F
COMPRESSED m-TH DATA
HIGHEST 5 BITS | LOWEST 3 BITS

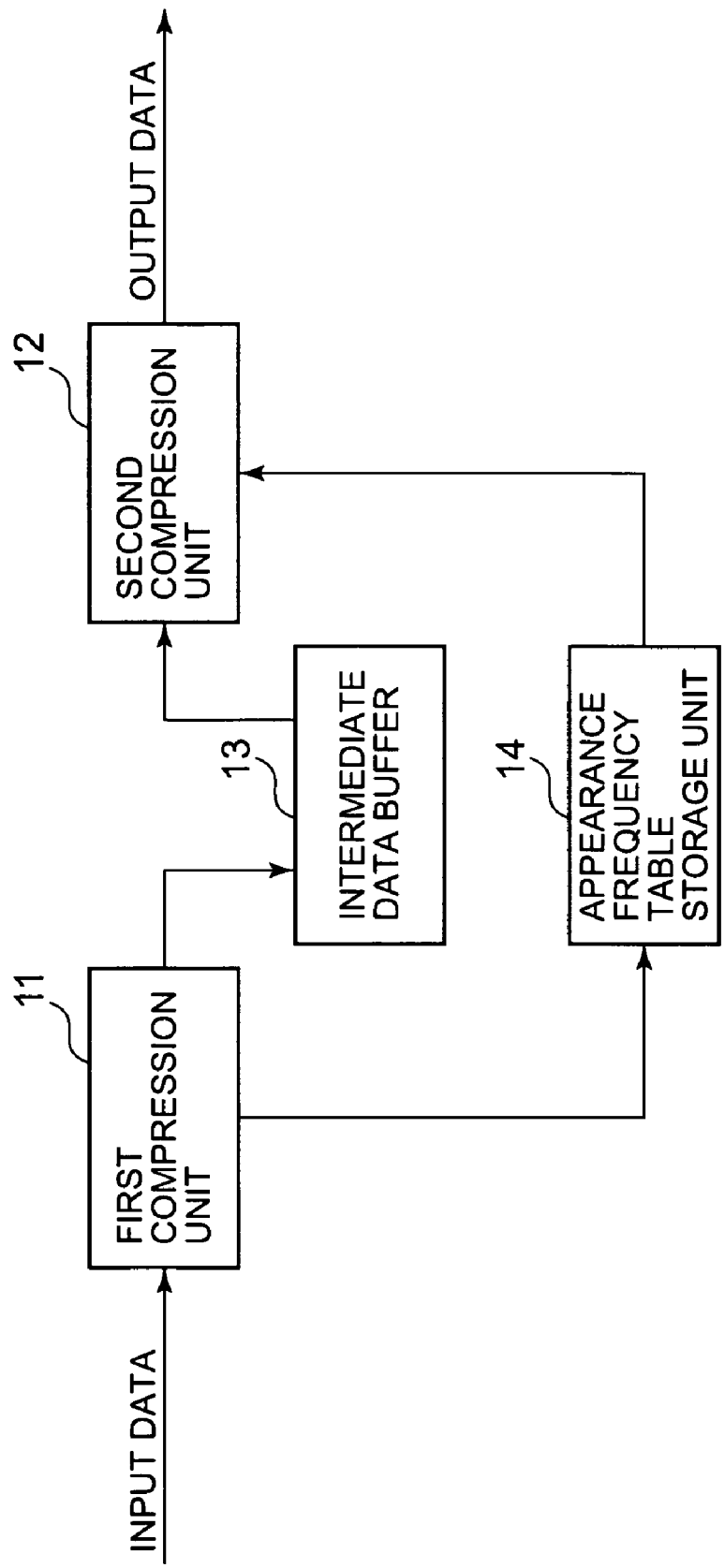

FIG. 15

| | CODE | SIZE OF CODED DATA |
|---|---|---|
| CASE 1 | 1ST ORDER CODE | 1 BIT |
| | OTHERS | 9 BITS |
| CASE 2 | 1ST ORDER CODE | 2 BITS |
| | 2ND-3RD ORDER CODES | 3 BITS |
| | OTHERS | 9 BITS |
| CASE 3 | 1ST ORDER CODE | 2 BITS |
| | 2ND-5TH ORDER CODES | 4 BITS |
| | OTHERS | 9 BITS |
| CASE 4 | 1ST ORDER CODE | 2 BITS |
| | 2ND-17TH ORDER CODES | 6 BITS |
| | OTHERS | 9 BITS |
| CASE 5 | 1ST ORDER CODE | 2 BITS |
| | 2ND-3RD ORDER CODES | 4 BITS |
| | 4TH-7TH ORDER CODES | 5 BITS |
| | OTHERS | 9 BITS |
| CASE 6 | 1ST ORDER CODE | 2 BITS |
| | 2ND-3RD ORDER CODES | 4 BITS |
| | 4TH-19TH ORDER CODES | 7 BITS |
| | OTHERS | 9 BITS |
| CASE 7 | 1ST ORDER CODE | 2 BITS |
| | 2ND-5TH ORDER CODES | 5 BITS |
| | 6TH-21TH ORDER CODES | 7 BITS |
| | OTHERS | 9 BITS |
| CASE 8 | 1ST ORDER CODE | 2 BITS |
| | 2ND-3RD ORDER CODES | 4 BITS |
| | 4TH-7TH ORDER CODES | 6 BITS |
| | 7TH-23RD ORDER CODES | 8 BITS |
| | OTHERS | 9 BITS |

FIG. 16

| | CODE | F1 DATA AREA | F2 DATA AREA | F3 DATA AREA | F4 DATA AREA | F5 DATA AREA | F6 DATA AREA | F7 DATA AREA | F8 DATA AREA |
|---|---|---|---|---|---|---|---|---|---|
| CASE 1 | 1ST ORDER CODE | 1 | – | – | – | – | – | – | – |
| | OTHERS | 0 | – | – | – | – | – | – | ORIGINAL INPUT DATA |
| CASE 2 | 1ST ORDER CODE | 1 | 0 | – | – | – | – | – | – |
| | 2ND-3RD ORDER CODES | 1 | 1 | – | – | – | – | – | – |
| | OTHERS | 0 | – | – | – | – | – | – | ORIGINAL INPUT DATA |
| CASE 3 | 1ST ORDER CODE | 1 | 0 | – | – | – | – | – | – |
| | 2ND-5TH ORDER CODES | 1 | 1 | – | – | 0 or 1 | – | – | – |
| | OTHERS | 0 | – | – | – | – | – | – | ORIGINAL INPUT DATA |
| CASE 4 | 1ST ORDER CODE | 1 | 0 | – | – | – | – | – | – |
| | 2ND-17TH ORDER CODES | 1 | 1 | – | – | – | 00h~11h | – | – |
| | OTHERS | 0 | – | – | – | – | – | – | ORIGINAL INPUT DATA |
| CASE 5 | 1ST ORDER CODE | 1 | 0 | – | – | – | – | – | – |
| | 2ND-3RD ORDER CODES | 1 | 1 | 0 | – | – | – | – | – |
| | 4TH-7TH ORDER CODES | 1 | 1 | 1 | – | 0 or 1 | – | – | – |
| | OTHERS | 0 | – | – | – | – | – | – | ORIGINAL INPUT DATA |
| CASE 6 | 1ST ORDER CODE | 1 | 0 | – | – | – | – | – | – |
| | 2ND-3RD ORDER CODES | 1 | 1 | 0 | – | – | – | – | – |
| | 4TH-19TH ORDER CODES | 1 | 1 | 1 | – | – | 00h~11h | – | – |
| | OTHERS | 0 | – | – | – | – | – | – | ORIGINAL INPUT DATA |
| CASE 7 | 1ST ORDER CODE | 1 | 0 | – | – | – | – | – | – |
| | 2ND-5TH ORDER CODES | 1 | 1 | – | 0 | – | – | – | – |
| | 6TH-21ST ORDER CODES | 1 | 1 | – | 1 | – | 00h~11h | – | – |
| | OTHERS | 0 | – | – | – | – | – | – | ORIGINAL INPUT DATA |
| CASE 8 | 1ST ORDER CODE | 1 | 0 | – | – | – | – | – | – |
| | 2ND-3RD ORDER CODES | 1 | 1 | 0 | – | – | – | – | – |
| | 4TH-7TH ORDER CODES | 1 | 1 | 1 | – | – | – | – | – |
| | 7TH-23RD ORDER CODES | 1 | 1 | 1 | – | – | – | 0000h~1111h | – |
| | OTHERS | 0 | – | – | – | – | – | – | ORIGINAL INPUT DATA |

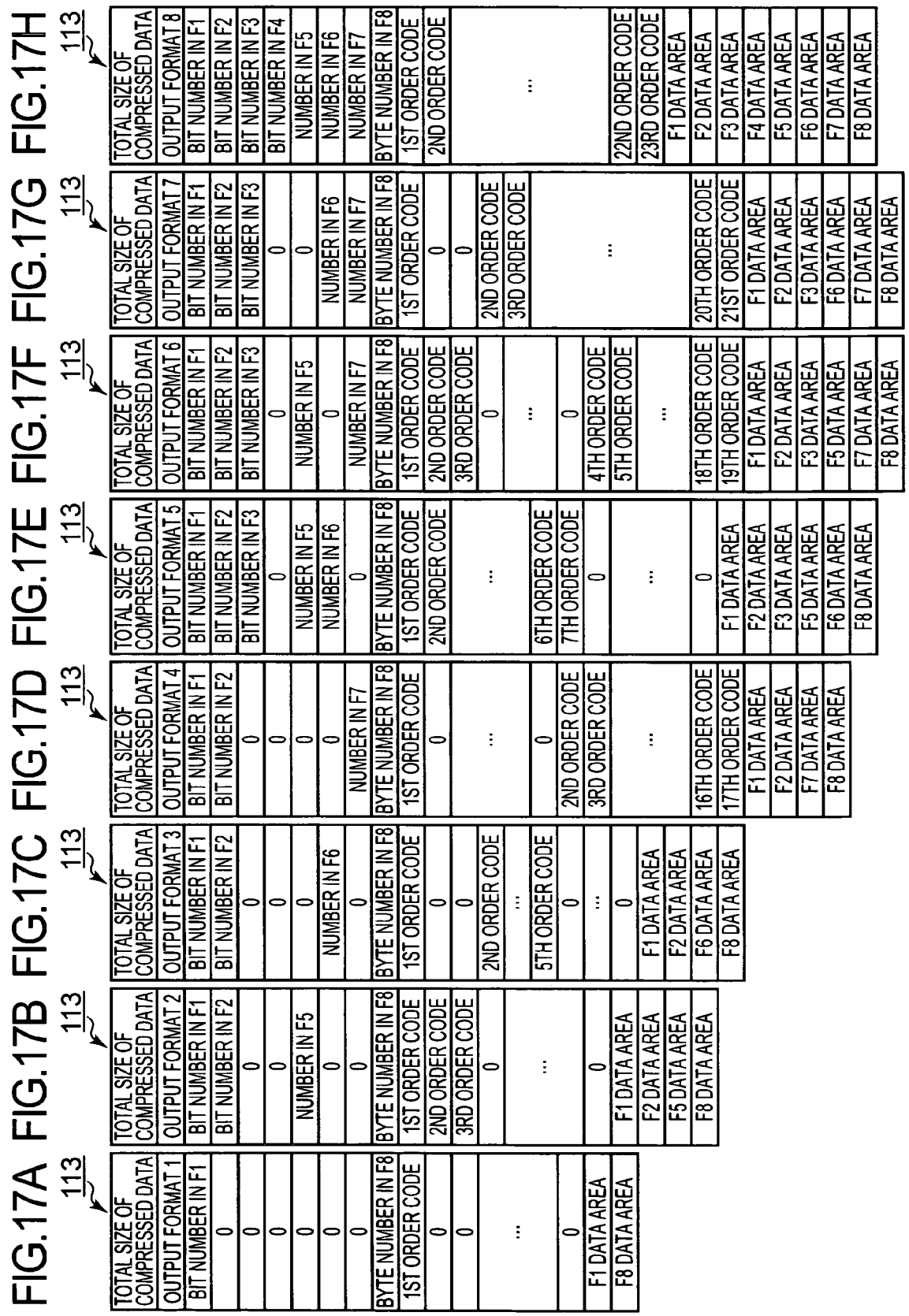

DATA COMPRESSION/DECOMPRESSION DEVICE AND DATA COMPRESSION/DECOMPRESSION METHOD

BACKGROUND OF THE INVENTION

1. Field of the Invention

The present invention relates to a device and method for compressing and decompressing various data such as character data, image data, etc.

2. Description of the Related Art

Along with the recent rapid development of computers, various information such as character information, vector information, image information, etc. are processed by computers, turning out a great amount of data. Under this current situation, there are proposed a data compression method for compressing the amount of data by omitting redundant portions included in the data to shorten the time required for data transmission or to enable efficient use of the storage capacity of storage devices, and a decompression method therefore.

Methods based on universal coding applicable to various data such as character information, vector information, image information, etc. are adopted as the coding method used for compressing data. Universal coding includes dictionary coding methods that take advantage of similarity between character strings and statistical coding methods that utilize the frequency of appearance of characters.

Lempel-Ziv coding is a typical example of the dictionary coding method. Two algorithms are proposed for Lempel-Ziv coding method; one is a sliding dictionary type (also called universal type) and the other is a dynamic dictionary type (also called increment resolvable type). Known as the improved versions of the sliding dictionary type algorithm are LZSS coding, QIC-122 coding which is a standard compression method for ¼-inch cartridge magnetic tapes, etc.

On the other hand, LZW (Lempel-Ziv-Welch) coding, etc. are known as the improvements of the dynamic dictionary type.

The statistical coding method aims for improving the compression efficiency by allocating longer coding lengths to characters that appear with a higher frequency of appearance, based on a statistical frequency of appearance (occurrence rate) of each character. For example, an arithmetic coding method and a Huffman coding method are known as the typical methods of the statistical coding method. According to the Huffman coding method, a code (Huffman code) having a coding length which is in inverse proportion to the appearance frequency of a character is used for the character.

Meanwhile, there is also a complex data compression method that takes both the way of the above-described dictionary coding method and the way of statistical coding method. Such a method includes an LZH method, which compresses data having been compressed by the above-mentioned LZSS method by the Huffman method. Since the LZSS method compresses data in the unit of character string whereas the Huffman method compresses data character by character, the effect of mutual complementation can be expected from the complex method of these.

An earlier sliding dictionary type algorithm (LZ1) will now be explained. This algorithm requires much computing, but can achieve a high compression rate. This algorithm divides the data to be coded into longest partial character strings each corresponding in its contained characters to those of a character string included in a past data flow and starting from an arbitrary position in the past data flow, and then codes each partial character string as a copy of the past character string. FIG. 28 is a diagram for explaining this principle.

In FIG. 28, a P buffer 281 stores input data already coded, and a Q buffer 282 stores data yet to be coded. A character string 283 input in the Q buffer 282 is compared, from its top, with the character string flow stored in the P buffer 281. If a longest character string 284 that corresponds in contained characters is found in the P buffer 281, the coding starts. For example, in a case where a corresponding character string 284 is found in the P buffer 281 as shown in FIG. 28, the data is compressed by setting the start position of the longest corresponding character string 284 as p1, and setting the length of the longest corresponding character string in the Q buffer 282 as q1. This coding compresses, for example, document information made up of character codes to ½ of its original length. An invention utilizing this sliding dictionary type algorithm is disclosed in, for example, Japanese Patent No. 3241788.

Next, the statistical coding method will be explained. As shown in FIG. 29, the statistical coding method involves an input data buffer 291, a statistic modeling unit 292, an appearance frequency table 293, and an entropy coding process unit 294. The statistic modeling unit 292 scans character strings stored in the input data buffer 291 and calculates the appearance frequency of each character. The entropy coding process unit 294 assigns a code generated based on the appearance frequency calculated by the statistic modeling unit 292 to each character.

The appearance frequency calculated by the statistic modeling unit 292 is classified into a rate for a static coding method in which the appearance frequency of each character is determined in advance, a rate for a semi-adaptive coding method in which the appearance frequency of each character is obtained by scanning the whole character string at the beginning of the process, and a rate for an adaptive coding method in which the frequency is reset every time each character appears to recalculate the appearance frequency. An invention utilizing the statistical coding method is disclosed in, for example, Japanese Patent No. 3276860.

However, the above-described coding methods have the following problems.

First, according to the dictionary coding method, a longest partial character string corresponding in the contained characters to those of the data to be coded is searched out from the character string already coded, and the data is coded as a copy of the partial character string, as described above. A structure that can attain a more and more improved data compression rate has to be employed in order to utilize this kind of algorithm. Such a structure also has to be capable of making the coded data convenient for computer processing.

For example, in order to improve the data compression rate in the dictionary coding method, it is necessary to increase the number of characters to be stored in the P buffer, and the same is required in the Q buffer. However, if the number of characters to be stored in the P buffer and Q buffer is increased, the data to be coded might not be a multiple of the bit number "8" bit-wise. This calls for complicated processes such as bit relocation when the data is to be transmitted. Furthermore, the amount of comparison computing is large, resulting in very poor compression efficiency.

In a case where the dictionary coding method is realized by hardware, the circuit scale will be enormously if the compression and decompression circuits are constructed on a single integrated circuit, greatly increasing the cost of the necessary hardware.

Furthermore, at the very beginning of the use, the sliding dictionary type algorithm codes the data with no reference data stock built in the dictionary. Therefore, the compression rate is low for the earlier input data, because of scarce contents being available in the dictionary.

On the other hand, according to the statistical coding method, since the coding process requires the involvement of the statistic modeling unit 292 and the entropy coding process unit 294 as the two-pass process between them, the processing speed is low. Furthermore, because of its nature as the variable length coding, this coding method requires bit treatment, which takes a long time, and besides, makes the coding logic complicated.

SUMMARY OF THE INVENTION

The present invention was made in view of the above circumstances, and an object of the present invention is to provide a data compression/decompression device and data compression/decompression method capable of achieving high-speed and high compression rate.

A data compression device according to a first aspect of the present invention comprises:

a first data compression unit which performs a first data compression process for compressing input data by a dictionary coding method; and a second data compression unit which performs a second data compression process for compressing the data compressed by the first data compression unit by a statistical coding method, wherein the first data compression unit searches for longest data that corresponds to the input data from already coded data in a dictionary, and decompresses the input data in a byte unit.

The first data compression unit may count an appearance frequency of same data included in the input data.

The second data compression unit may perform data compression by using a count result of the appearance frequency counted by the first data compression unit.

The data compression device may further comprise a size calculation/determination unit which calculates a first amount of output data to be output when the input data is compressed only by the first compression unit and a second amount of output data to be output when first output data obtained by the compressing of the input data by the first compression unit is further compressed by the second compression unit, and determines whether the second amount of output data is larger than the first amount of output data, wherein when the size calculation/determination unit determines that the second amount of output data is larger than the first amount of output data, the second compression unit may refrain from performing the second data compression process.

The size calculation/determination unit may further calculate a third amount of output data to be output when the input data is compressed only by the second compression unit, and compares the first amount of output data, the second amount of output data, the third amount of output data, and a data amount of the input data.

In a case where the first amount of output data is the smallest, only the first compression unit may perform compression.

In a case where the second amount of output data is the smallest, both the first compression unit and the second compression unit may perform compression.

In a case where the third amount of output data is the smallest, only the second compression unit may perform compression.

In a case where the data amount of the input data is the smallest, neither the first compression unit nor the second compression unit may perform compression.

The data compression device may further comprise a compression efficiency determination unit which determines whether or not same character data continuously appears in the input data, and instructs the first compression unit or the second compression unit to perform a run length compression process, in a case where determining that same character data continuously appears.

The first compression unit or the second compression unit may calculate size of data after being compressed before performing the data compression process, determine a data output pattern that will achieve a smallest size of data, and find an output format based on a result of the determination.

The output format may include areas set for a predetermined number of character codes that have highest frequencies of appearance among character codes included in the input data, and store data that associates code numbers of the predetermined number of character codes with the frequencies of appearance of the predetermined number of character codes.

A data decompression device according to a second aspect of the present invention comprises:

a first decompression unit which decompresses compressed data by a method corresponding to a statistical coding method; and a second decompression unit which further decompresses the data decompressed by the first decompression unit by a method corresponding to a dictionary coding method.

The data decompression device may further comprise a determination unit which determines a value of identification data included in the compressed data, wherein:

in a case where the determination unit determines that the identification data is first identification data, the first decompression unit may decompress the compressed data, and the second decompression unit may further decompress the data obtained by the decompressing by the first decompression unit; and in a case where the determination unit determines that the identification data is second identification data, the first decompression unit may decompress the compressed data.

In a case where the determination unit determines that the identification data is third identification data, the second decompression unit may decompress the compressed data.

A data compression method according to a third aspect of the present invention comprises:

a first data compressing step of performing a first data compression process for compressing input data by a dictionary coding method; and a second data compressing step of performing a second data compression process for compressing the data compressed at the first data compressing step by a statistical coding method, wherein at the first data compressing step, longest data that corresponds to the input data is searched out from already coded data in a dictionary, compressed, and output in a byte unit.

At the first data compressing step, an appearance frequency of same data included in the input data may be counted.

At the second data compressing step, data compression may be performed by using a count result of the appearance frequency counted at the first data compressing step.

The data compression method may further comprise a size calculating/determining step of calculating a first amount of output data to be output when the input data is compressed only at the first compressing step and a second amount of output data to be output when first output data obtained by the compressing of the input data at the first data compressing step is further compressed at the second data compressing step, and determining whether the second amount of output data is larger than the first amount of output data, wherein in a case where it is determined at the size calculating/determining step that the second amount of output data is larger than the first amount of output data, the second data compression process may refrain from being performed at the second data compressing step.

At the size calculating/determining step, a third amount of output data to be output when the input data is compressed only at the second data compressing step may further be calculated, and the first amount of output data, the second amount of output data, the third amount of output data, and a data amount of the input data may be compared;

in a case where the first amount of output data is the smallest, compression may be performed only at the first data compressing step;

in a case where the second amount of output data is the smallest, compression may be performed both at the first data compressing step and at the second data compressing step;

in a case where the third amount of output data is the smallest, compression may be performed only at the second data compressing step; and in a case where the data amount of the input data is the smallest, compression may be performed neither at the first data compressing step nor at the second data compressing step.

The data compression method may further comprise a compression efficiency determining step of determining whether or not same character data continuously appears in the input data, and instructing a run length compression process to be performed at the first data compressing step or the second data compressing step, in a case where it is determined that same character data continuously appears.

At the first data compressing step or the second data compressing step, size of data after being compressed may be calculated before data compression is performed, an output pattern that will achieve a smallest size of data may be determined, and an output format may be found based on a result of the determination.

The output format may include areas set for a predetermined number of character codes that have highest frequencies of appearance among character codes included in the input data, and store data that associates code numbers of the predetermined number of character codes with the frequencies of appearance of the predetermined number of character codes.

A data decompression method according to a fourth aspect of the present invention comprises:

a first data decompressing step of decompressing compressed data by a method corresponding to a statistical coding method; and a second data decompressing step of further decompressing the data decompressed at the first data decompressing step by a method corresponding to a dictionary coding method.

The data decompression method may further comprise a determining step of determining a value of identification data included in the compressed data, wherein:

in a case where it is determined at the determining step that the identification data is first identification data, the compressed data may be decompressed at the first data decompressing step, and the data obtained by decompressing at the first data decompressing step may be decompressed at the second data decompressing step; and in a case where it is determined at the determining step that the identification data is second identification data, the compressed data may be decompressed at the first data decompressing step.

In a case where it is determined at the determining step that the identification data is third identification data, the compressed data may be decompressed at the second data decompressing step.

According to the present invention, with the use of the first compression unit and the second compression unit, it is possible to provide a data compression/decompression device and a data compression/decompression method capable of achieving high-speed and high compression rate. According to the present invention, the first compression unit codes input data by using a dictionary coding method, and the second compression unit codes input data by using a statistical coding method.

BRIEF DESCRIPTION OF THE DRAWINGS

These objects and other objects and advantages of the present invention will become more apparent upon reading of the following detailed description and the accompanying drawings in which:

FIG. 3A is a diagram showing the structure of input data, FIG. 3B is a diagram showing a specific structure of compressed data, FIGS. 3C and 3D are diagrams for explaining the structure of flag data, FIG. 3E is a diagram for explaining the structure of un-compressed data, and FIG. 3F is a diagram for explaining the structure of compressed structure;

FIG. 4 is a diagram for explaining the structure of a data compression device according to an embodiment 2;

FIG. 15 is a diagram showing relationship between codes in each determination pattern and the size of coded data;

FIG. 16 is a diagram showing data to be set in output data buffers in each determination pattern;

FIG. 17A to FIG. 17H are diagrams each showing an output format of the compression format that is determined to be output based on determination made based on calculation results obtained by a compression efficiency determination unit;

DETAILED DESCRIPTION OF THE PREFERRED EMBODIMENTS

The embodiments of the present invention will now be explained with reference to the drawings.

Embodiment 1

Figure 1:
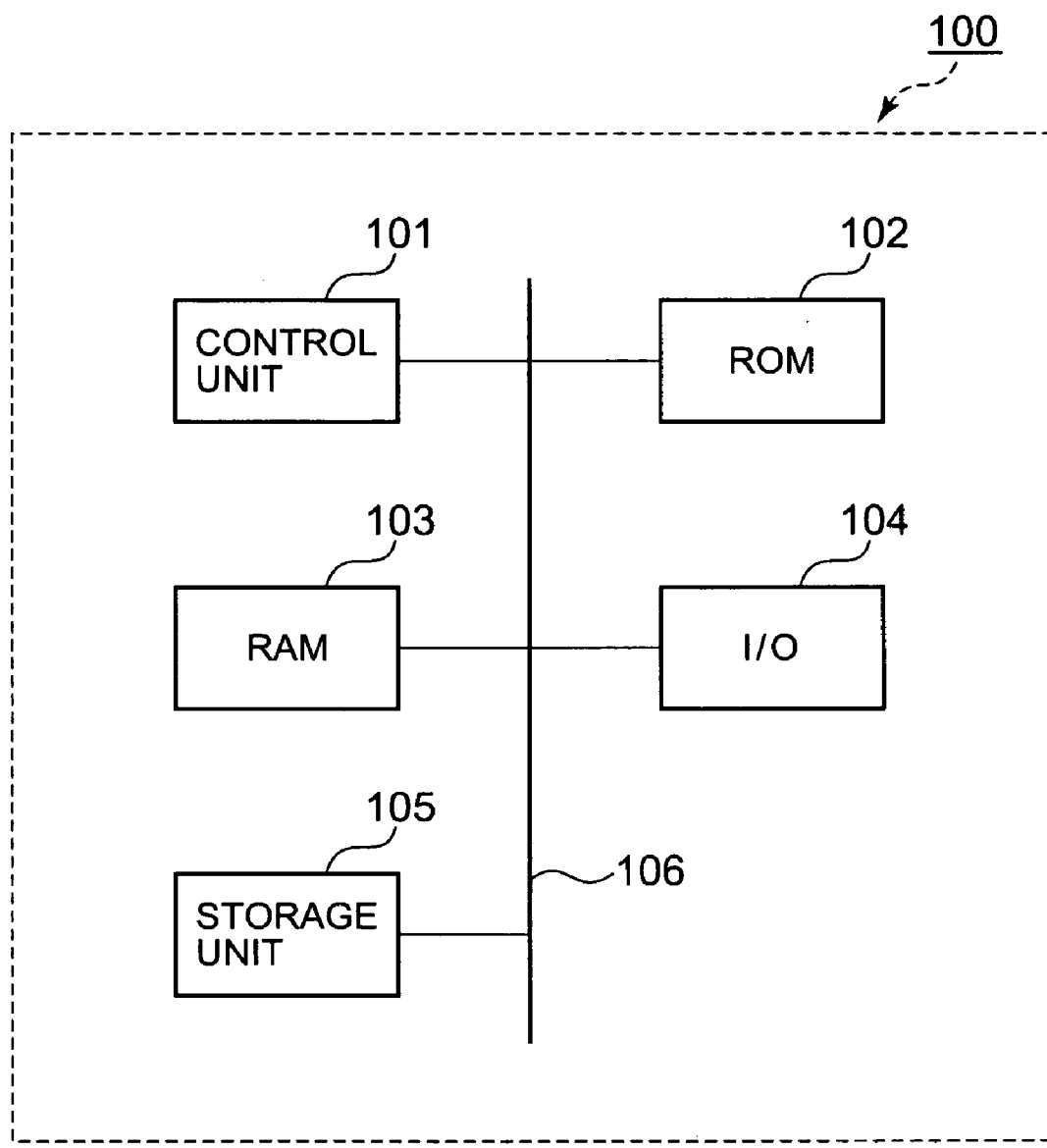
FIG. 1 is a block diagram showing the structure of a data compression device according to the present invention.

FIG. 1 is a block diagram of a data compression device 100 according to the present embodiment.

The data compression device 100 comprises a control unit 101, a ROM (Read Only memory) 102, a RAM (Random Access Memory) 103, an I/O (Input/Output) 104, an external storage unit 105, and system bus 106.

The control unit 101 is constituted by a CPU (Central Processing Unit) or the like, and have control on the whole data compression device 100. The control unit 101 reads programs, etc. stored in the ROM 102 and the RAM 103 and performs predetermined processes based on the read programs, etc.

The ROM 102 is a non-volatile memory that stores an operating system (hereinafter referred to as "OS"), programs, etc. necessary for the control on the whole data compression device 100. The control unit 101 reads the OS, programs, etc. from the ROM 102 when necessary, and performs predetermined processes based on the OS, programs, etc. The data compression device 100 may be structured such that the OS, programs, etc. are stored in the storage unit 105, and the control unit 101 reads the OS, programs, etc. from the storage unit 105 when necessary and performs predetermined processes based on them.

The RAM 103 is a volatile memory for storing programs read by the control unit 101 for performing predetermined processes, or storing data necessary for executing the programs.

The I/O 104 performs data input or data output, by being connected to a drive device such as a CD-ROM drive, etc. for reading from or writing on a removable disk such as a CD (Compact Disk), etc. or by being connected to an input device such as a keyboard, a mouse, etc. For example, the I/O 104 receives input data to be coded by the control unit 101, and inputs the received data to the control unit 101.

The storage unit 105 is constituted by a storage device such as a hard disk drive, etc.

A system bus 106 is a transmission path for transmitting instructions and data between the control unit 101, the ROM 102, the RAM 103, the I/O 104, and the storage unit 105.

Next, the system configuration of the data compression device 100 according to the present embodiment will be explained with reference to FIG. 2.

Figure 2:
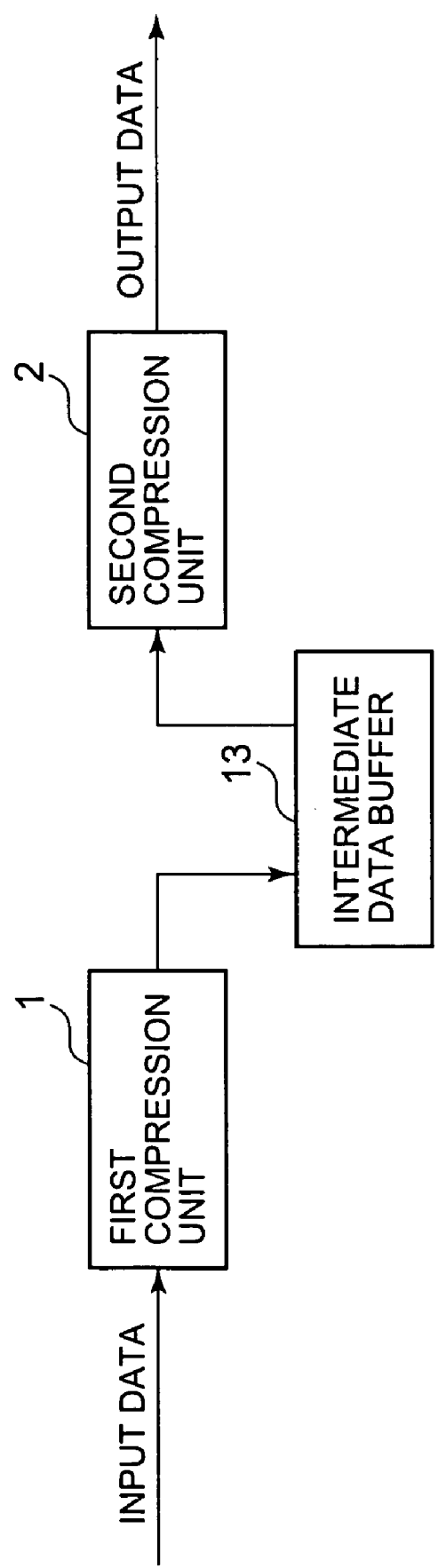
FIG. 2 is a diagram showing the system configuration of a data compression device according to an embodiment 1.

In FIG. 2, a first compression unit 1 compresses input data by an adaptive dictionary coding method (Lempel-Ziv method), whereas a second compression unit 2 compresses input data by a semi-adaptive statistical coding method. The input data is input to the first compression unit 1 and coded by the first compression unit 1, generating first compressed data. The first compressed data obtained by the first compression unit 1 is supplied to an intermediate data buffer 13. The data is further compressed by the second compression unit 2, and second compressed data is generated.

For example, the first compression unit 1 and the second compression unit 2 are comprised in the first control unit 101. The intermediate data buffer 13 is comprised in the RAM 103. Alternatively, these units may be structured as independent circuits for performing the above-described processes.

Data to be input to the first compression unit 1 is, for example, character data, vector data, image data, etc. The first compression unit 1 codes input data by an adaptive dictionary coding method for coding data based on a partial data string that is searched out from already coded data as corresponding in its contents to the input data for the longest term. The first compression unit 1 outputs coded data except a later-described identifier flag in the form of 1-byte data, and makes a bundle of eight identifier flags (each made of 1 bit) and outputs it in the form of 1-byte data, thereby outputting all data in the byte unit.

FIGS. 3 are diagrams for specifically explaining the above-described configuration. First, as shown in FIG. 3A, an input data buffer 3 includes a P buffer 4 and a Q buffer 5. The P buffer 4 is a history buffer and made up of 32bytes. The Q buffer 5 is supplied with input data, and made up of 9 bytes. A sliding window 6 is slidable in the direction of the arrow shown in FIG. 3A.

Specifically, the first compression unit 1 slides the sliding window 6 in the direction of the arrow of FIG. 3A to take in the input data to the Q buffer 5.

FIG. 3B is a diagram showing a specific structure of compressed data. The first 1 byte is flag data, which is followed by eight compressed data (or uncompressed data).

As shown in FIG. 3C, the flag data is 1-byte (8-bit) data, and according to the resent embodiment, a value "0" indicates uncompressed data whereas a value "1" indicates compressed data. The first to eighth flags shown in FIG. 3C correspond to the first to eighth data of the compressed data (or uncompressed data) following the flag data.

For example, in a case where the first flag of the flag data shows a flag value "1", the first data of the eight compressed data (or uncompressed data) is 1-byte (8-bit) compressed data. FIG. 3F shows a structure example of the m-th data (m being an integer equal to or larger than 1 and equal to or smaller than 8) which is compressed data. In this case, the highest 5 bits of the m-th data indicates a correspondence start position, and the lowest 3 bits indicates the length of the corresponding character string. The P buffer 4 is a buffer having a capacity that can be represented by 5 bits. For example, assuming that the lowest 3 bits being "000" indicates that the length of the corresponding character string is 2 bytes, the first compression unit 1 can make a correspondence search for character string data of up to 9 bytes.

On the other hand, in a case where the first flag of the flag data shows a flag value "0", the first data of the eight compressed data (or uncompressed data) is 1-byte (8-bit) uncompressed data. FIG. 3E shows a structure example of the m-th data which is uncompressed data, and the uncompressed original data is stored in this structure.

The same applies to the second to eighth data, which therefore represent compressed data or uncompressed data that correspond to the statuses of the flags recorded in the flag data. The flag data that succeeds the above-described eight compressed data (or uncompressed data) includes information on the next ninth to sixteenth compressed data (or uncompressed data), as shown in FIG. 3D.

According to the present embodiment, the P buffer 4 (history buffer) as the sliding dictionary and the Q buffer 5 are formed in a small size, and the first compression unit 1 outputs all data in the byte unit where each coded data (except its identifier flag) is made of 1-byte data.

Consequently, according to the present embodiment, the compression process can be accelerated. Further, in terms of hardware structures, the history array, the shift register as the "sliding dictionary P buffer", the comparator, etc. can be formed in a small size, resulting in a small circuit scale.

Further, the second compression unit 2 being prepared, a highly compressible and highly efficient data compression can be realized.

Still further, both the first compression unit 1 and the second compression unit 2 can handle the data in the byte unit, which can reduce bit treatment as much as possible and contribute to the process acceleration.

Yet further, the first compression unit 1 and the second compression unit 2 are of the universal coding type, and therefore can code any types of data such as character data, graphic data, etc. at a high speed and with high compression efficiency.

Embodiment 2

The embodiment 2 of the present invention will now be explained.

FIG. 4 is a diagram for explaining the structure of a compression device according to the present embodiment. A first compression unit 11 compresses data by an adaptive dictionary coding method (Lempel-Ziv method), and a second compression unit 12 compresses data by a semi-adaptive statistical coding method. The first compression unit 11 of the present embodiment is designed to simultaneously count appearance frequency to be used by the second compression unit 12. These will now be explained more specifically.

Input data is input to the first compression unit 11 and is coded to generate first compressed data. The input data to be input to the first compression unit 11 is, for example, character data, etc. The first compression unit 11 codes the input data based on a partial string that is searched out from the already coded data in the dictionary as corresponding in contents to the input data for the longest term. The obtained first compressed data is supplied to an intermediate data buffer 13. When a certain amount of data is supplied, the intermediate buffer 13 outputs the first compressed data to the second compression unit 12.

In the meantime, the first compression unit 11 performs a process for counting appearance frequency that is necessary in the compression process by the second compression unit 12, and outputs the count result to an appearance frequency table storage unit 14. That is, first compression unit 11 generates an appearance frequency table to be used by the second compression unit 12, so that the second compression unit 12 can efficiently compress data by the statistical coding method.

Note that, for example, the first compression unit 11 and the second compression unit 12 are comprised in the control unit 101. The intermediate data buffer 13 and the appearance frequency table storage unit 14 are comprised in the RAM 103. Alternatively, these units may be structured as circuits for performing the above-described processes.

In this manner, according to the present embodiment, the first compression unit 11 generates coded data, and simultaneously counts the appearance frequency to generate an appearance frequency table. This allows the second compression unit 12 not to count the appearance frequency, but to perform compression efficiently by using the appearance frequency table, contributing to the acceleration of the compression process.

Embodiment 3

The embodiment 3 of the present invention will now be explained.

Figure 5:
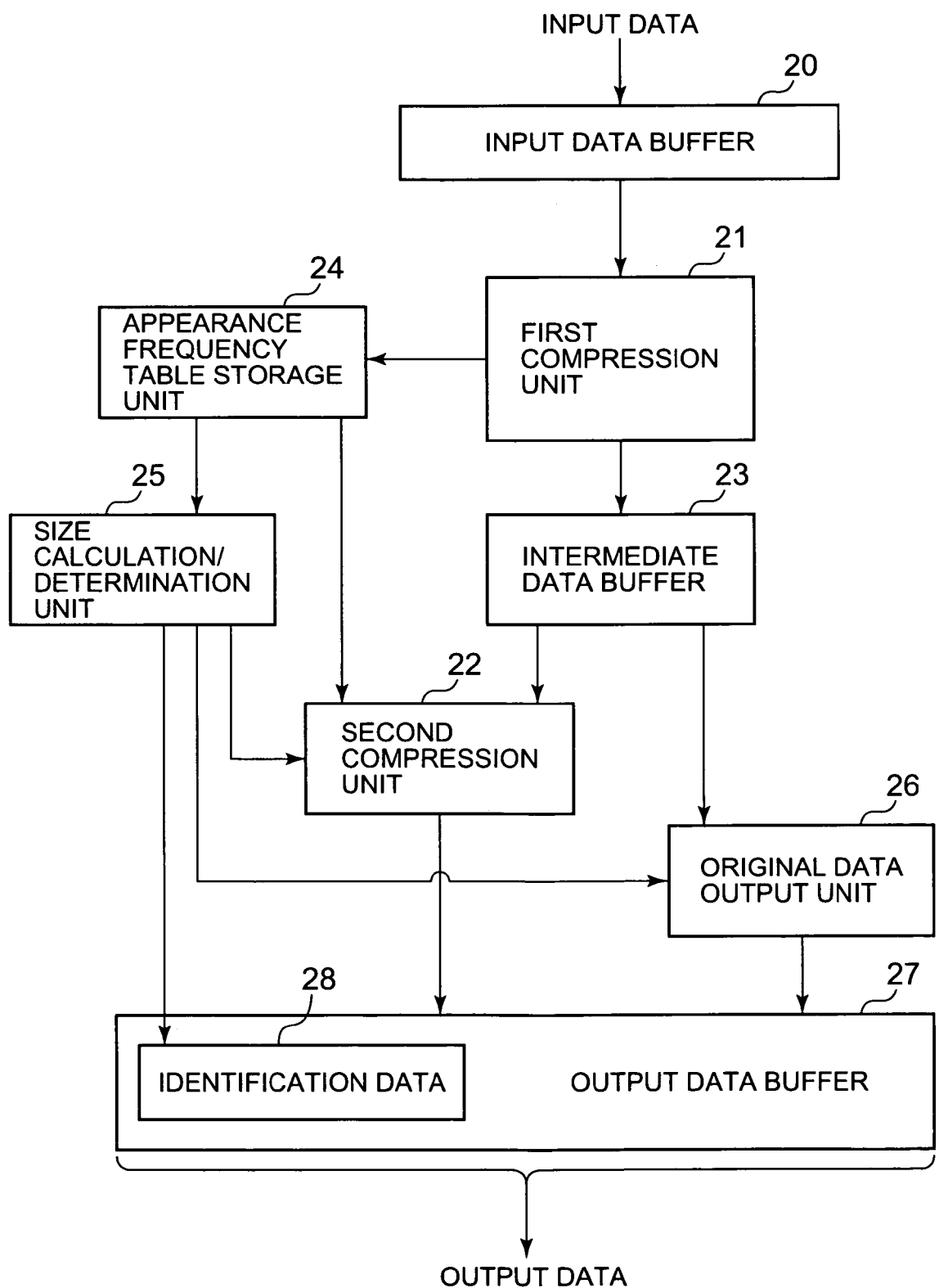
FIG. 5 is a diagram for explaining the structure of a data compression device according to an embodiment 3.

FIG. 5 is a diagram for explaining the structure of a compression device according to the present embodiment. In FIG. 5, input data such as character data or the like is supplied to the input data buffer 20. The input data is further supplied from the input data buffer 20 to a first compression unit 21. Likewise the foregoing embodiment, the first compression unit 21 compresses data by an adaptive dictionary coding method, and also performs the process for counting the frequency of appearance of an identical character string. These will now be explained more specifically.

The first compression unit 21 codes input data and outputs it to an intermediate data buffer 23, and simultaneously measures the size of the first compressed data output from the first compression unit 21 and counts the appearance frequency of an identical character string as described above.

An appearance frequency table storage unit 24 stores an appearance frequency table for recording the appearance frequency. The appearance frequency table storage unit 24 upcounts the data output from the first compression data 21 and stores appearance frequency data for, for example, each character code.

A size calculation/determination unit 25 calculates the size (or compression rate) of second compressed data to be generated when a second compression unit 22 performs data compression, determines whether the amount of data to be output will be larger in size than the first compressed data, and outputs identification data 28 indicating the determination result.

For example, in a case where determining that the output data amount will be larger, the size calculation/determination unit 25 outputs a value "1" as the identification data 28.

To the contrary, in a case where determining that the output data amount will not be larger, the size calculation/determination unit 25 outputs a value "2" as the identification data 28.

Further, in a case where determining that the output data amount will be larger, the size calculation/determination unit 25 instructs an original data output unit 26 to output the first compressed data stored in the intermediate data buffer 23 to an output data buffer 27, without a second compression process being applied to the first compressed data. On the other hand, in a case where determining that the output data amount will not be larger, the size calculation/determination unit 25 instructs the second compression unit 22 to acquire the first compressed data stored in the intermediate data buffer 23 to perform the second compression process on the acquired data.

Figure 6A:
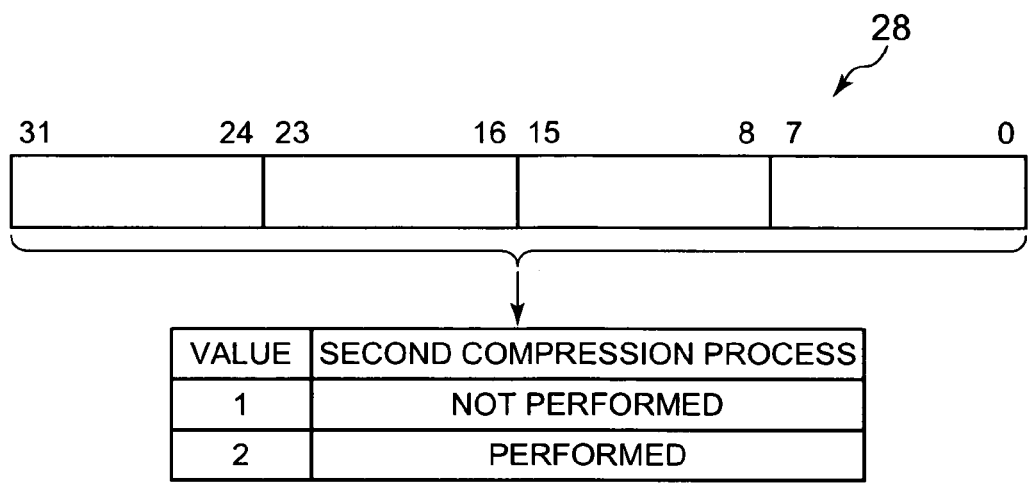
FIGS. 6A and 6B are diagrams showing examples of identification data.
Figure 6B:
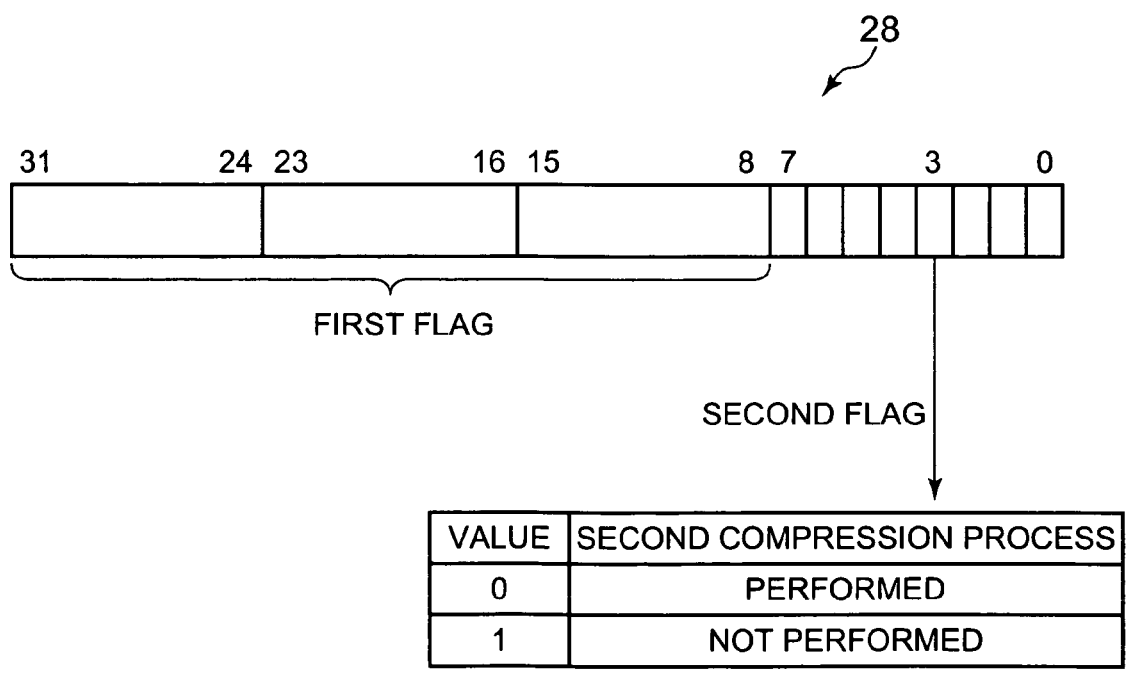

FIGS. 6 are diagrams showing structure examples of the identification data 28. For example, the identification data 28 includes two types, namely one showing that the first compression process has been performed but the second compression process has not been performed, and one showing that the first compression process has been performed and the second compression process has also been performed, as shown in FIG. 6A. Instead of these two, the identification data 28 may be made up of a first flag indicating that compression has been performed, and a second flag indicating that the second compression process has been performed/not been performed, as shown in FIG. 6B.

Through these steps, the identification data 28 and the compressed data are input to the output data buffer 27. The output data buffer 27 outputs data only compressed by the first compression unit 21, or data compressed both by the first compression unit 21 and the second compression unit 22.

The first compression unit 21, the second compression unit 22, the size calculation/determination unit 25, and the original data output unit 26 are comprised in the control unit 101. The input data buffer 20, the intermediate data buffer 23, the appearance frequency table storage unit 24, and the output data buffer 27 are comprised in the RAM 103. Alternatively, these units may be structures as circuits for performing the above-described processes.

As described above, according to the present embodiment, after the first compression process is performed, the size (or compression rate) of the compressed data in case of the second compression process being applied thereto is calculated. If the amount of the data after the second compression process is larger than the size of the data only after the first compression process, the second compression process will not be performed. This can avoid the second compression process which will result in producing a larger data size than the first compressed data. That is, the second compression process can be prevented from being performed wastefully, making the compression process more efficient.

Embodiment 4

The embodiment 4 of the present invention will now be explained.

Figure 7:
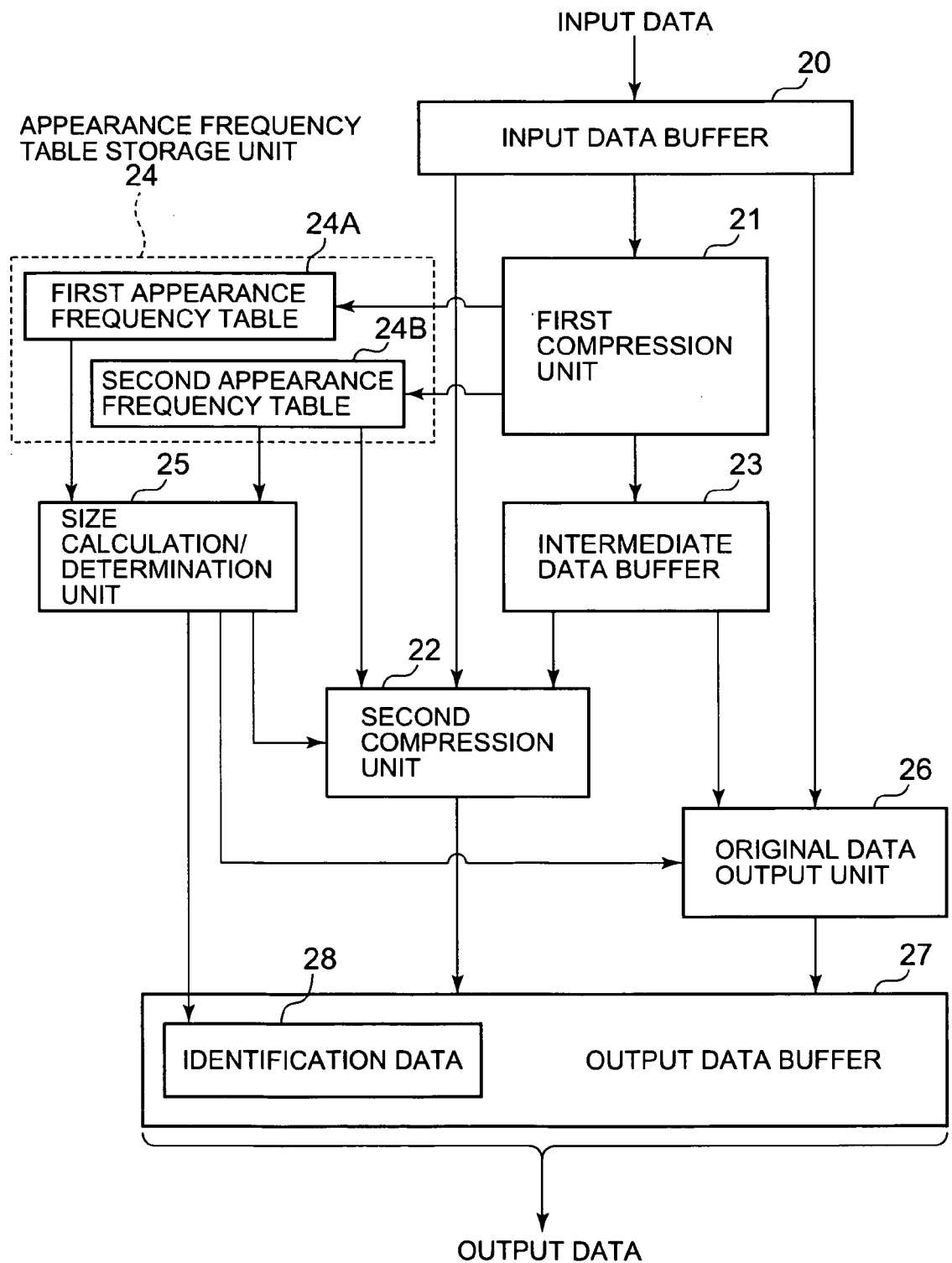
FIG. 7 is a diagram for explaining the structure of a data compression device according to an embodiment 4.

FIG. 7 is a diagram for explaining the structure of a compression device according to the present embodiment. According to the present embodiment, one more appearance frequency table is prepared in addition to the one in the embodiment 3, in order to enable a more efficient compression process. This will be explained more specifically below. The same reference numerals will be given to the same components as those in the embodiment 3.

Likewise the aforementioned embodiment, input data such as character data or the like is supplied to the input data buffer 20. The input data supplied to the input data buffer 20 is further supplied to the first compression unit 21. The first compression unit 21 compresses the input data by an adaptive dictionary coding method, and outputs first compressed data to the intermediate data buffer 23. The first compression unit 21 measures the size of the input data and that of the first compressed data, and also counts the appearance frequency of an identical character string.

According to the present embodiment, the appearance frequency table storage unit 24 stores a first appearance frequency table 24A and a second appearance frequency table 24B, both of which store data representing the appearance frequency for, for example, each character code, likewise the above-described embodiment. For example, the appearance frequency table 24A stores the appearance frequency for each data included in the input data, and the appearance frequency table 24B stores the appearance frequency for each data included in the first compressed data. The size calculation/determination unit 25 calculates the size (or compression rate) of second coded data to be generated when the second compression unit 22 performs data compression, and determines whether the amount of data to be output will be larger in size than the first compressed data.

The size calculation/determination unit 25 calculates the following four sizes for performing the process to be described later.

(1) the size of the input data: SIZE_INPUT
(2) the output size of the first compressed data: SIZE_1
(3) the output size when the input data is compressed only by the second compression unit 22: SIZE_2
(4) the output size when the first compressed data is further compressed by the second compression unit 22: SIZE_12

In a case where the size SIZE_INPUT of the input data is the smallest, the input data is output with no treatment added. That is, the size calculation/determination unit 25 outputs identification data 28 that shows a value "1", and instructs the original data output unit 26 to output the data stored in the input data buffer 20 with no treatment added. The original data output unit 26 acquires the input data supplied to the input data buffer 20, and outputs it to the output data buffer 27.

In a case where the size SIZE_1 of the first compressed data is the smallest, the first compression unit 21 performs compression, but the second compression unit 22 does not perform compression. That is, the size calculation/determination unit 25 outputs identification data 28 showing a value "2", and instructs the original data output unit 26 to output the first compressed data stored in the intermediate data buffer 23. The original data output unit 26 outputs the first compressed data stored in the intermediate data buffer 23 to the output data buffer 27.

In a case where SIZE_2 is the smallest, the first compression unit 21 does not perform compression, but the second compression unit 22 performs compression of the input data. That is, the size calculation/determination unit 25 outputs identification data 28 showing a value "3", and instructs the second compression unit 22 to acquire the input data from the input data buffer 20 and apply the second compression process to the input data. The second compression unit 22 acquires the input data from the input data buffer 20, applies the second compression process, and outputs the obtained compressed data to the output data buffer 27.

In a case where the SIZE_12 is the smallest, the first compression unit 21 performs compression of the input data, and the second compression unit 22 further performs compression of the obtained first compressed data to obtain second compressed data. That is, the size calculation/determination unit 25 outputs identification data 28 showing a value "4", and instructs the second compression unit 22 to perform data compression. The second compression unit 22 acquires the first compressed data stored in the intermediate data buffer 23 to apply a further compression thereto, and outputs the obtained second compressed data to the output data buffer 27.

Figure 8A:
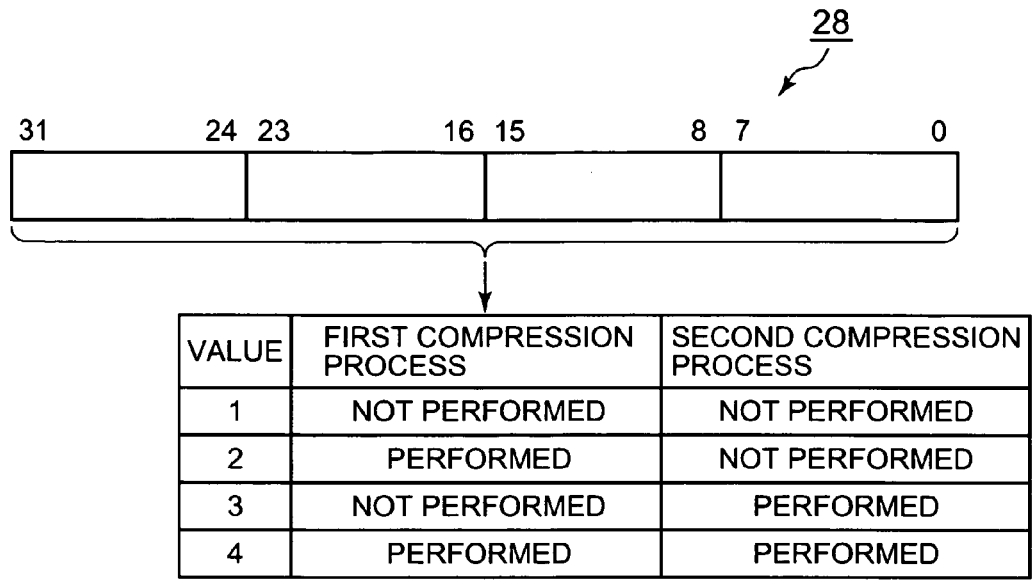
FIGS. 8A and 8B are diagrams showing examples of identification data.

For example, each value of the identification data 28 has the meaning shown in FIG. 8A. That is, the value "1" indicates that none of the first and second compression processes has been performed. The value "2" indicates that the first compression process has been performed but the second compression process has not been performed. The value "3" indicates that the first compression process has not been performed but the second compression process has been performed. The value "4" indicates that both the first and second compression processes have been performed.

Figure 8B:
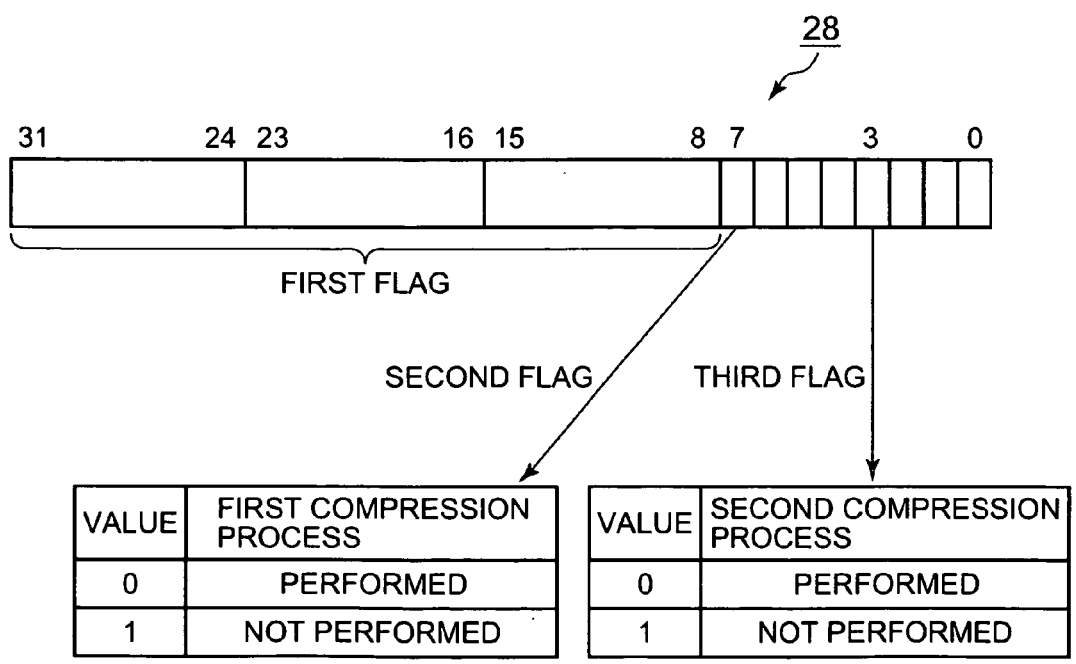

Instead of the above four values, the identification data 28 may be made up of a first flag indicating that compression has been performed, a second flag indicating that the first compression process has been performed/not been performed, and a third flag indicating that the second compression process has been performed/not been performed, as shown in FIG. 8B.

For example, the first compression unit 21, the second compression unit 22, the size calculation/determination unit 25, and the original data output unit 26 are comprised in the control unit 101. The input data buffer 20, the intermediate data buffer 23, the appearance frequency table storage unit 24, and the output data buffer 27 are comprised in the RAM 103. Alternatively, these may be structured as circuits for performing the above-described processes.

As described above, according to the present embodiment, the first and second compression processes may be combined so that the most efficient compression method may be selected, while the size of the data after compression can be prevented from resulting in being larger than the size of the input data.

Embodiment 5

The embodiment 5 of the present invention will now be explained.

Figure 9:
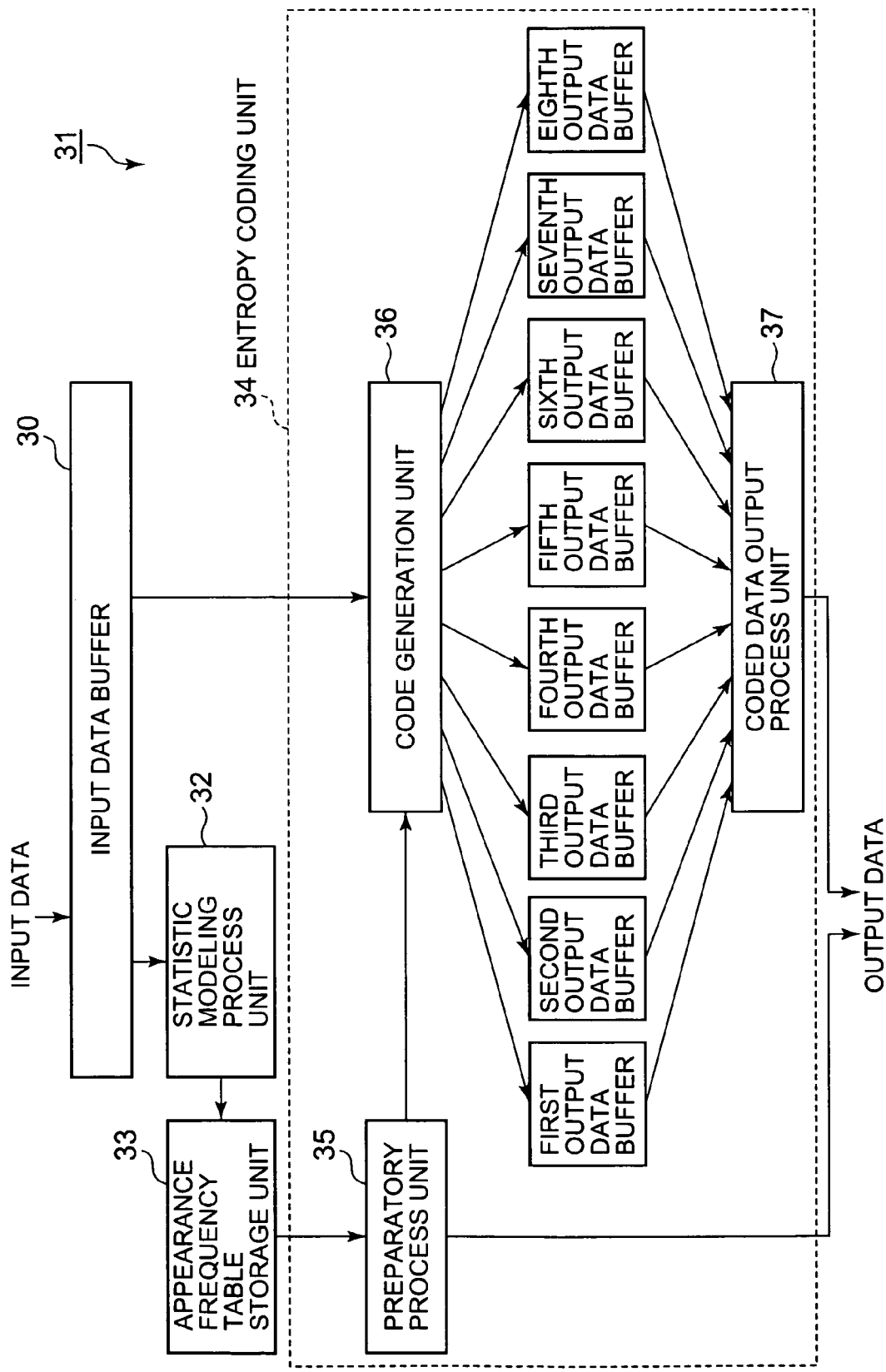
FIG. 9 is a diagram for explaining the structure of a data compression device according to an embodiment 5.

FIG. 9 is a diagram for explaining the structure of a compression device according to the present embodiment. In the present embodiment, the compression process by a semi-adaptive statistical coding method will be explained unlike the foregoing embodiments 1 to 4. The compression device 31 comprises an input data buffer 30, a statistic modeling process unit 32, an appearance frequency table storage unit 33, and an entropy coding unit 34. These will now be explained more specifically.

First, input data such as character data or the like is supplied to the input data buffer 30. For example, first compressed data obtained by the compression by the above-described first compression unit 21 is supplied to the input data buffer 30. The input data supplied to the input data buffer 30 is supplied to the statistic modeling process unit 32. The statistic modeling process unit 32 counts the appearance frequency of each data. The count result of the appearance frequency is supplied to the appearance frequency table storage unit 33. The appearance frequency table storage unit 33 stores the supplied count result of the appearance frequency in an appearance frequency table 111.

The entropy coding unit 34 comprises a preparatory process unit 35, a code generation unit 36, a first output data buffer to an eighth output data buffer, and a coded data output process unit 37.

The preparatory process unit 35 calculates the size of compressed data, allocates data among the first output data buffer to the eighth output data buffer, and performs a later-described process for outputting codes of the 1st to 23rd orders to the header area of output data. The code generation unit 36 generates an appropriate compression format 113 to be described later, based on the order information generated by the preparatory process unit 35.

Figure 10:
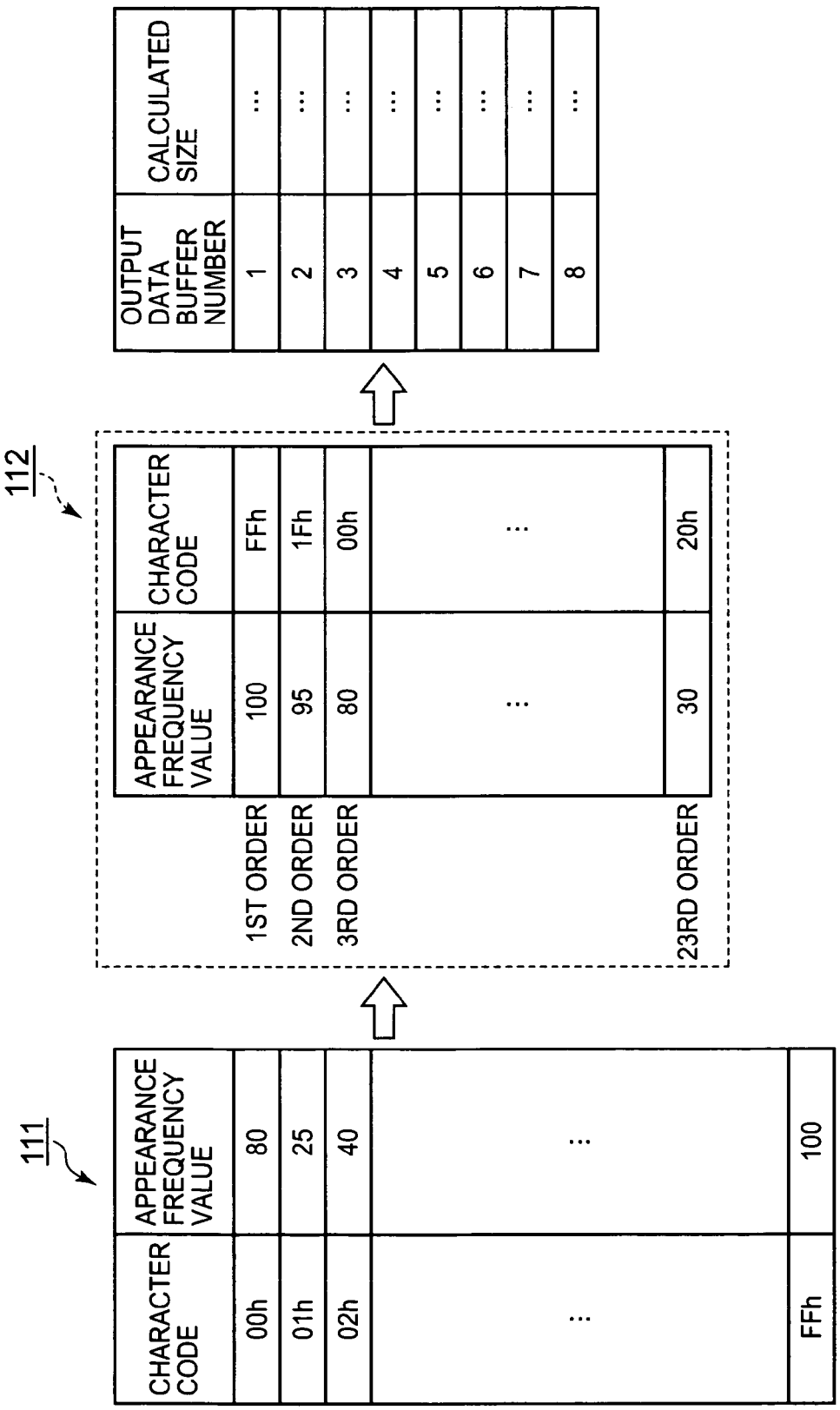
FIG. 10 is a diagram for explaining the configuration of a preparatory process unit.

First, the process of the preparatory process unit 35 will be explained. FIG. 10 is a diagram for explaining the schematic configuration and process of the preparatory process unit 35. The appearance frequency values shown in FIG. 10 are mere examples. The appearance frequency table 111 stored in the appearance frequency table storage unit 33 stores appearance frequency values corresponding to character codes (byte data 00h to FFh). The tail character "h" of the character code represents that the character code is a hexadecimal number. Based on these appearance frequency values, the preparatory process unit 35 generates a code table 112 that associates frequently appearing character codes that rank 23rd or higher in the order of appearance frequency, with the appearance frequency values of these character codes. For example, the code table 112 is stored in the RAM 103.

Figure 11:
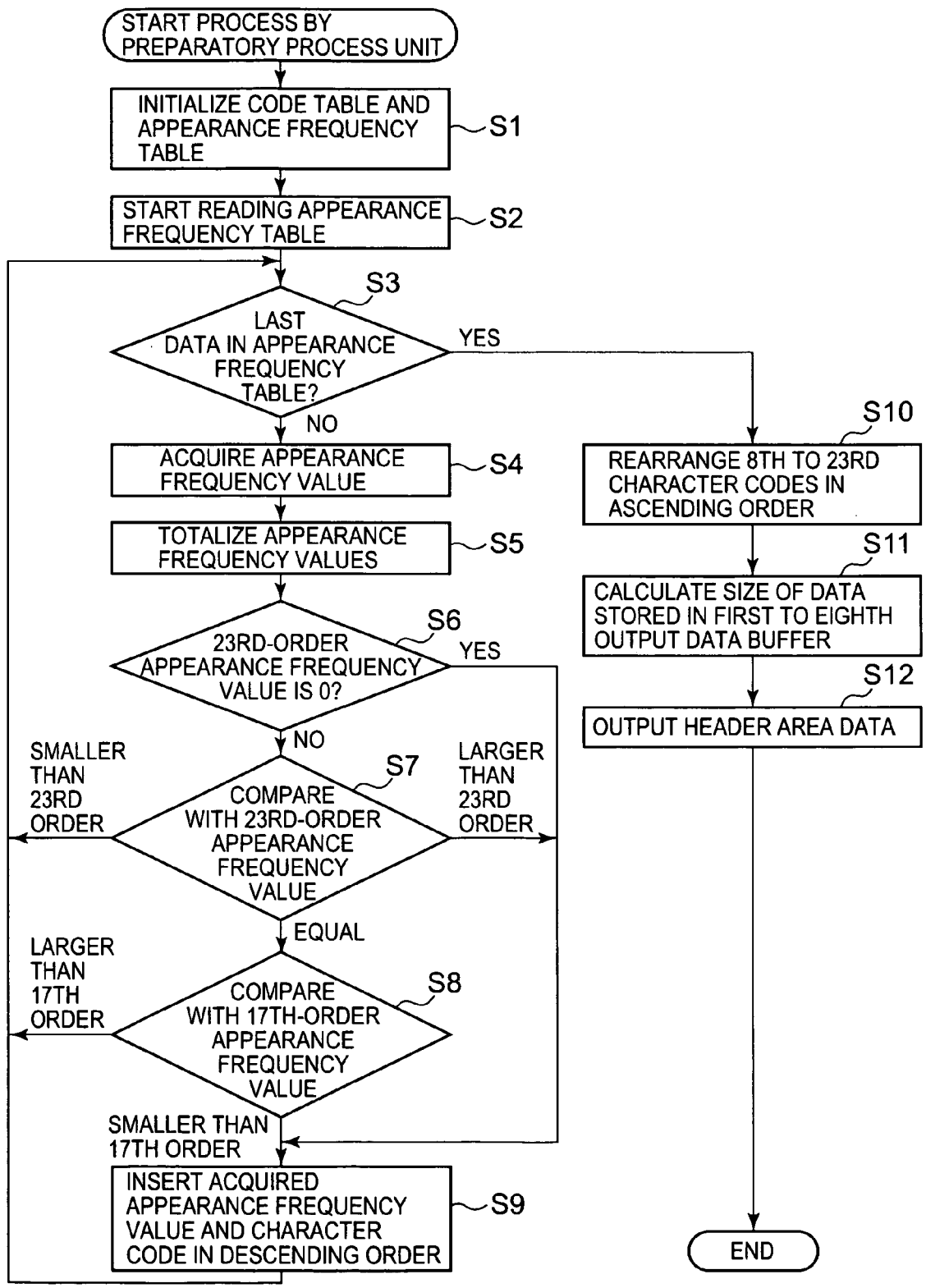
FIG. 11 is a flowchart for explaining a process performed by the preparatory process unit.

FIG. 11 is a flowchart for explaining the process performed by the preparatory process unit 35.

First, the preparatory process unit 35 initializes the code table 112 and the appearance frequency table 111 (step S1).

When data compression is started by the compression device 31, the statistic modeling process unit 32 updates the appearance frequency table 111 as described above.

Next, the preparatory process unit 35 starts reading the data stored in the appearance frequency table 111 (step S2). The preparatory process unit 35 determines whether the reading reaches the last data stored in the appearance frequency table 111 (step S3). In a case where the last data in the appearance frequency table 111 is not reached (step S3; NO), the preparatory process unit 35 acquires the currently reached appearance frequency value from the appearance frequency table 111 (step S4).

The preparatory process unit 35 totalizes the appearance frequency values to obtain the number of input data (step S5). Then, the preparatory process unit 35 determines whether the appearance frequency value of the 23rd character code stored in the code table 112 is 0 or not (step S6). In a case where the appearance frequency value of the 23rd character code is not 0 (step S6; NO), the preparatory process unit 35 compares the acquired appearance frequency value with the appearance frequency value of the 23rd character code (step S7). In a case where it is smaller than the appearance frequency value of the 23rd character code, the preparatory process unit 35 determines that the character code associated with the acquired appearance frequency value is not a frequently appearing one, and returns to step S3. To the contrary, in a case where it is larger than the appearance frequency value of the 23rd character code, the flow goes to step S9.

In a case where the appearance frequency value corresponds to one of the 23rd order, the preparatory process unit 35 determines whether the character code is larger than the 23rd character code (step S8). Then, the preparatory process unit 35 adopts the small character code when there are any character codes with same appearance frequency value. In a case where the character code of the acquired character data is larger than the 23rd character code, the flow returns to step S3. To the contrary, in a case where the character code of the acquired character data is smaller than the 23rd character code, the flow goes to step S9.

The preparatory process unit 35 inserts the acquired appearance frequency value and its associated character code in the right place in the code table 112 storing the 1st to 23rd appearance frequency values, so that the appearance frequency values are arranged in the descending order (step S9). Then, returning to step S3, the preparatory process unit 35 repeats the process from step S3 through step S9 until all the data in the appearance frequency table 111 are read out.

Through this process, character codes and associated appearance frequency values are stored in the code table 112 in the order from 1st to 23rd appearance frequencies.

When all the data in the appearance frequency table are read out (step S3; YES), the preparatory process unit 35 rearranges the 8th to 23rd character codes in the ascending order (step S10).

Then, the preparatory process unit 35 calculates the size of data to be stored in the first output data buffer to eighth output data buffer (step S11).

For example, the size of the data to be stored in each output data buffer is calculated based on the following equations.

(1) the size of the data to be stored in the first output data buffer (SIZE_BUF1)=(the number of input data+7)/8 bytes (2) the size of the data to be stored in the second output data buffer (SIZE_BUF2)=(the total of the 1st to 23rd appearance frequency values+7)/8 bytes (3) the size of the data to be stored in the third output data buffer (SIZE_BUF3)=(the total of the 2nd to 23rd appearance frequency values+7)/8 bytes (4) the size of the data to be stored in the fourth output data buffer (SIZE_BUF4)=(the total of the 4th to 23rd appearance frequency values+7)/8 bytes (5) the size of the data to be stored in the fifth output data buffer (SIZE_BUF5)=(the total of the 2nd to 23rd appearance frequency values+7)/8 bytes (6) the size of the data to be stored in the sixth output data buffer (SIZE_BUF6)=(the total of the 4th to 7th appearance frequency values+3)/4 bytes (7) the size of the data to be stored in the seventh output data buffer (SIZE_BUF7)=(the total of the 8th to 23rd appearance frequency values+1)/2 bytes (8) the size of the data to be stored in the eighth output data buffer (SIZE_BUF8)=the number of input data-the total of the 1st to 23rd appearance frequency values.

Next, the preparatory process unit 35 generates a compression format 113 for storing compressed data to be generated by the code generation unit 36. The preparatory process unit outputs data including information on the 1st to 23rd character codes to the header area of the compression format (step S12).

Figure 12:
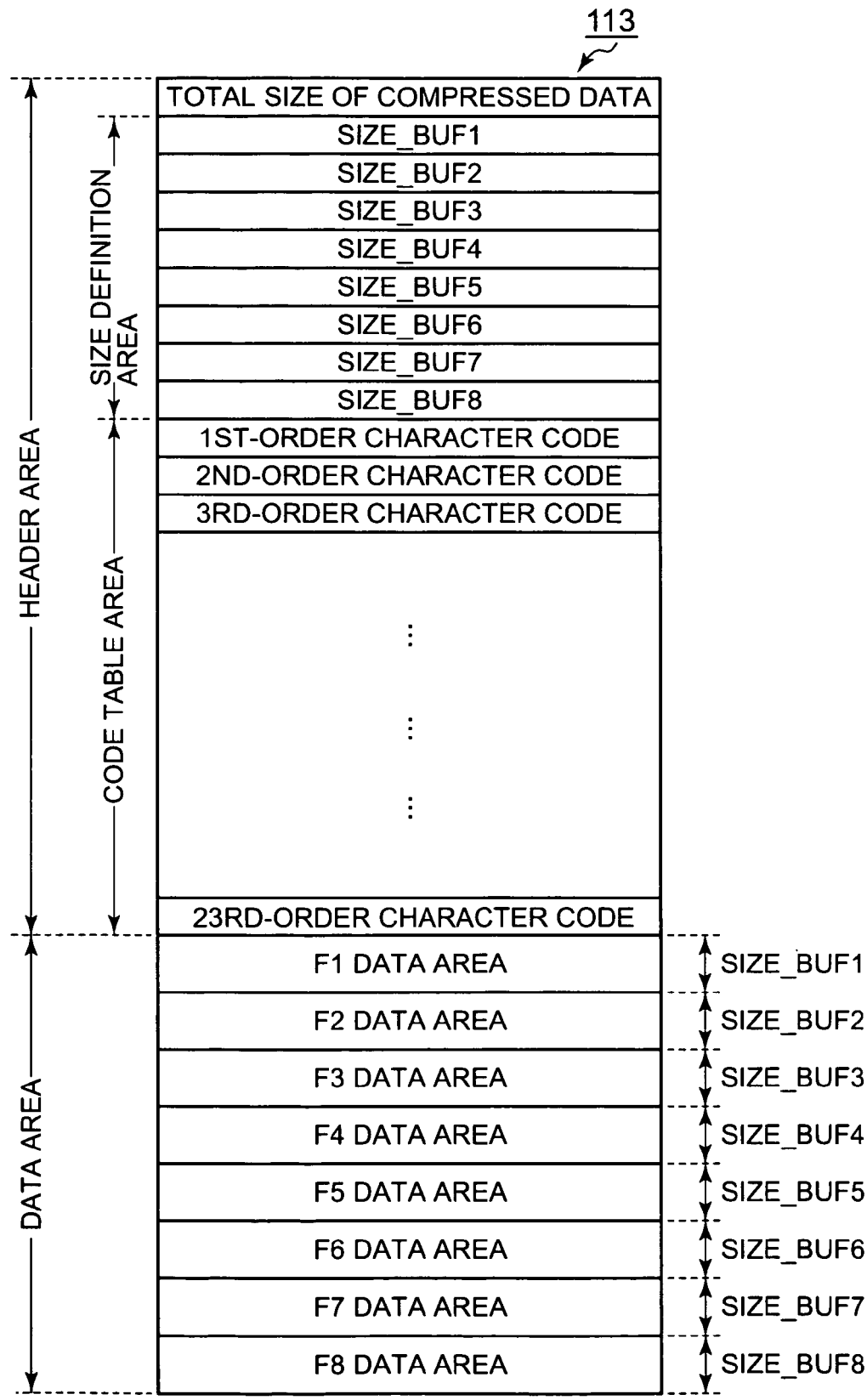
FIG. 12 is a diagram showing an example of a compression format.

FIG. 12 shows an example of the compression format 113. The compression format 113 is formed of the header area and eight data areas corresponding to the first to eighth output data buffers. The header area is formed of an area for storing the total size of the compressed data, a size definition area for storing the sizes of the data to be stored in the data areas corresponding to the first to eighth output data buffers, and 1st to 23rd code table areas.

Figure 13:
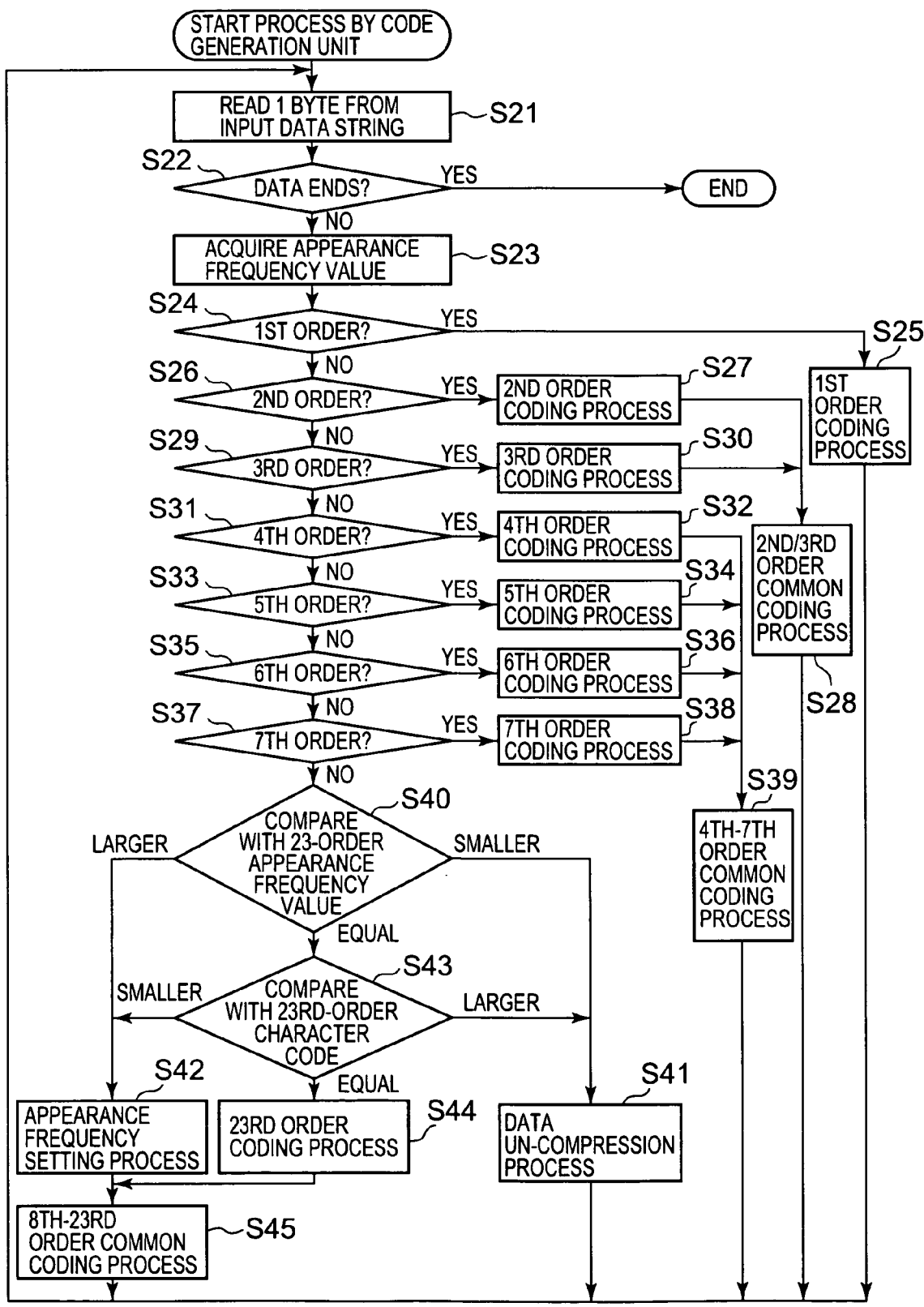
FIG. 13 is a flowchart for explaining a process performed by a code generation unit.

The code generation unit 36 sets specific values in the compression format 113 in accordance with a flowchart shown in FIG. 13, based on the data supplied from the preparatory process unit 35.

First, the code generation unit 36 reads 1 byte of data from the input data supplied in the input data buffer 30 (step S21). The code generation unit 36 determines whether the read 1-byte data is the last data of the input data string (step S22). In a case where it is not the last data of the input data string (step S22; NO), the code generation unit 36 acquires the information on the appearance frequency of the read 1-byte data (step S23). In a case where the read 1-byte data is the last data of the input data string (step S22; YES), the process is terminated.

The code generation unit 36 determines whether the read 1-byte data corresponds to the character code of the 1st order in the order of appearance frequency (step S24). In a case where the read 1-byte data corresponds to the character code of the 1st order (step S24; YES), the code generation unit 36 performs a 1st order coding process (step S25). Specifically, the code generation unit 36 turns on the bit (i.e. sets a value 1 to the bit) in the first output data buffer, and turns off the bit (i.e. sets a value 0 to the bit) in the second output data buffer.

In a case where the read 1-byte data does not correspond to the character code of the 1st order (step S24; NO), the code generation unit 36 determines whether the 1-byte data corresponds to the character code of the 2nd order (step S26). In a case where the 1-byte data corresponds to the character code of the 2nd order (step S26; YES), the code generation unit 36 performs a 2nd order coding process. Specifically, the code generation unit 36 turns off the bit in the fifth output data buffer (step S27). Furthermore, the code generation unit 36 performs a 2nd/3rd order common coding process (step S28). Specifically, the code generation unit 36 turns on the bit in the first output data buffer, turns on the bit in the second output data buffer, and turns off the bit in the third output data buffer.

In a case where the read 1-byte data does not correspond to the character code of the 2nd order at step S26 (step S26; NO), the code generation unit 36 determines whether the 1-byte data corresponds to the character code of the 3rd order (step S29). In a case where the 1-byte data corresponds to the character code of the 3rd order (step S29; YES), the code generation unit 36 performs a 3rd order coding process (step S30). Specifically, the code generation unit 36 turns on the bit in the third output data buffer. Furthermore, the code generation unit 36 performs the above-described 2nd/3rd order common coding process (step S28).

In a case where the read 1-byte data does not correspond to the character code of the 3rd order at step S29 (step S29; NO), the code generation unit 36 determines whether the 1-byte data corresponds to the character code of the 4th order (step S31). In a case where the 1-byte data corresponds to the character code of the 4th order (step S31; YES), the code generation unit 36 performs a 4th order coding process (step S32). Specifically, the code generation unit 36 sets "00h" in the sixth output data buffer. Further, the code generation unit 36 performs a 4th–7th order common coding process (step S39). Specifically, the code generation unit 36 turns on the bit in the first output data buffer, turns on the bit in the second output data buffer, turns on the bit in the third output data buffer, and turns off the bit in the fourth output data buffer.

In a case where the read 1-byte data does not correspond to the character code of the 4th order at step S31 (step S31; NO), the code generation unit 36 determines whether the 1-byte data corresponds to the character code of the 5th order (step S33). In a case where the 1-byte data corresponds to the character code of the 5th order (step S33; YES), the code generation unit 36 performs a 5th order coding process (step S34). Specifically, the code generation unit 36 sets "01h" to the sixth output data buffer. Further, the code generation unit 36 performs the above-described 4th–7th order common coding process (step S39).

In a case where the read 1-byte data does not correspond to the character code of the 5th order at step S33 (step S33; NO), the code generation unit 36 determines whether the 1-byte data corresponds to the character code of the 6th order (step S35). In a case where the 1-byte data corresponds to the character code of the 6th order (step S35; YES), the code generation unit 36 performs a 6th order coding process (step S36). Specifically, the code generation unit 36 sets "10h" in the sixth output data buffer. Further, the code generation unit 36 performs the above-described 4th–7th order common coding process (step S39).

In a case where the read 1-byte data does not correspond to the character code of the 6th order at step S35 (step S35; NO), the code generation unit 36 determines whether the 1-byte data corresponds to the character code of the 7th order (step S37). In a case where the 1-byte data corresponds to the character code of the 7th order (step S37; YES), the code generation unit 36 performs a 7th order coding process (step S38). Specifically, the code generation unit 36 sets "11h" in the sixth output data buffer. Further, the code generation unit 36 performs the above-described 4th–7th order common coding process (step S39).

Next, the code generation unit 36 compares the appearance frequency of the character code of the 23rd order with the appearance frequency of the read character code (step S40). In a case where the appearance frequency of the read character code is smaller than that of the character code of the 23rd order, the code generation unit 36 determines that the read character code is not a frequently appearing code, and performs a data un-compression process (step S41). Specifically, the code generation unit turns off the bit in the first output data buffer, and sets the read character code data in the eighth output data buffer.

To the contrary, in a case where the appearance frequency of the read character code is larger than that of the character code of the 23rd order, the code generation unit 36 performs an appearance frequency setting process (step S42). Specifically, the code generation unit 36 performs, for example, a binary search on the 8th to 22nd data in the code table 112, and sets the order of the character code that is searched out as corresponding to the read character code in the seventh output data buffer.

In a case where the appearance frequency of the read character code is equal to that of the character code of the 23rd order, the code generation unit 36 compares the read data with the character code of the 23rd order (step S43). In a case where they are the same, the code generation unit 36 performs a 23rd order coding process (step S44). Specifically, the code generation unit 36 sets the character code of the 23rd order in the seventh output data buffer.

Next, the code generation unit 36 performs an 8th–23rd order common coding process (step S45). Specifically, the code generation unit 36 turns on the bit in the first output data buffer, turns on the bit in the second output data buffer, turns off the bit in the third output data buffer, and turns on the bit in the fourth output data buffer.

The code generation unit 36 repeats this process until it reaches the last data of the input data. Then, the coded data output process unit 37 outputs the data stored in the first output data buffer to the eighth output data buffer based on the above-described compression format 113. In the following explanation, the area in the compression format 113 that corresponds to the n-th output data buffer will be referred to as an Fn data area. The symbol "n" represents an integer equal to or larger than 1 and equal to or smaller than 8.

For example, the statistic modeling process unit 32, the preparatory process unit 35, the code generation unit 36, and the coded data output process unit 37 are comprised in the control unit 101. The input data buffer 30, the appearance frequency table storage unit 33, and the first to eighth output data buffers are comprised in the RAM 103. Alternatively, these may be structured as circuits for performing the above-described processes.

By the above-described process, the output format of the coded data can be adapted to the variable length coding where the character code of the 1st order is 2 bits, the codes of the 2nd to 3rd orders are 4 bits, the codes of the 4th to 7th orders are 6 bits, the codes of the 8th to 23rd orders are 8 bits, and uncompressed data is 9 bits. In addition, by dividing the output data area into the first output data buffer to the eighth output data buffer, the memory can be accessed in the predetermines sizes (i.e., bit access in 1-bit unit, 2-bit unit, and 4-bit unit, and byte access in 1-byte data unit) in the coding or decoding process, enabling the compression process to be performed at a very high speed.

Embodiment 6

The embodiment 6 of the present invention will now be explained.

Figure 14:
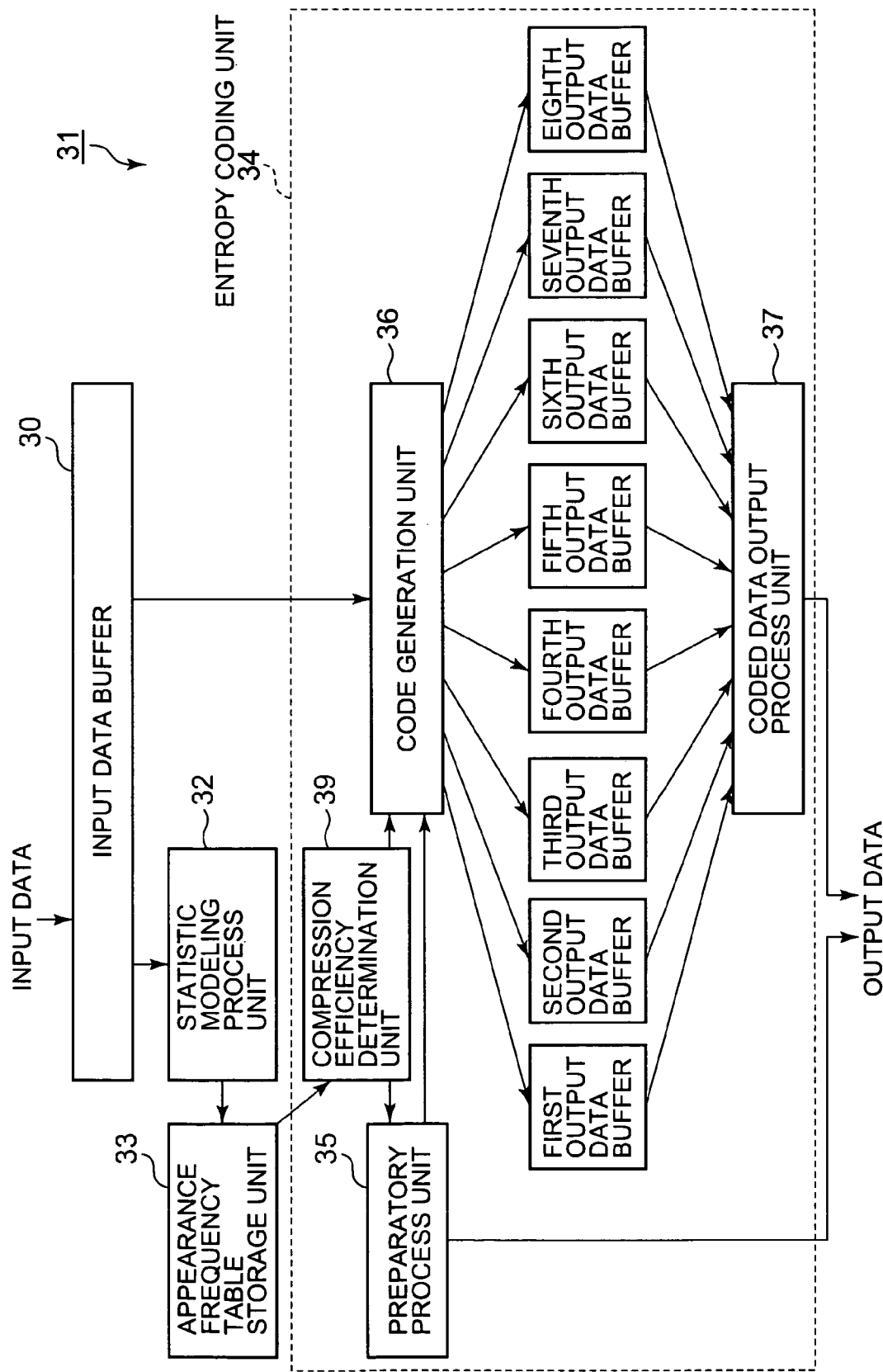
FIG. 14 is a diagram for explaining the structure of a data compression device according to an embodiment 6.

FIG. 14 is a diagram for explaining the structure of a compression device according to the present embodiment. According to the present embodiment, unlike in the embodiment 5 described above, the compression device comprises a compression efficiency determination unit 39 that calculates the compression size for each output format and determines the most efficient coding.

First, input data such as the above-described character data or the like is supplied to the input data buffer 30. The input data supplied to the input data buffer 30 is supplied to the statistic modeling process unit 32. The statistic modeling process unit 32 counts the appearance frequency of each byte data included in the input data. The count result of the appearance frequency is supplied to the appearance frequency table storage unit 33.

The appearance frequency table storage unit 33 stores the count result of the appearance frequency in the appearance frequency table 111.

The entropy coding unit 34 comprises a preparatory process unit 35, a code generation unit 36, a compression efficiency determination unit 39, a first output data buffer to an eighth output data buffer, and a coded data output process unit 37.

The preparatory process unit 35 calculates the size of compressed data, allocates the compressed data among the first to eighth output data buffers, and performs a later-described process for outputting codes and the like of the 1st to 23rd orders to the header area of the compression format 113. The code generation unit 36 codes the input data on a data-by-data basis, based on the order information generated by the preparatory process unit 35, as will be described later. The preparatory process performed by the preparatory process unit 35 will be performed in accordance with the foregoing flowchart of FIG. 11.

The compression efficiency determination unit 39 calculates the size of data compressed in predetermined output formats on a format-by-format basis based on data supplied from the appearance frequency table storage unit 33, and determines the output format that will have the smallest size.

FIG. 15 is a diagram showing examples of output formats. According to FIG. 15, the output formats include eight patterns as follows.

(Case 1) The code of the 1st order in the order of appearance frequency is coded into 1-bit data and the other codes are coded into 9-bit data.

(Case 2) The code of the 1st order is coded into 2-bit data, the codes of 2nd to 3rd orders are coded into 3-bit data, and the other codes are coded into 9-bit data.

(Case 3) The code of the 1st order is coded into 2-bit data, the codes of 2nd to 5th orders are coded into 4-bit data, and the other codes are coded into 9-bit data.

(Case 4) The code of the 1st order is coded into 2-bit data, the codes of the 2nd to 17th orders are coded into 6-bit data, and the other codes are coded into 9-bit data.

(Case 5) The code of the 1st order is coded into 2-bit data, the codes of the 2nd to 3rd orders are coded into 4-bit data, the codes of the 4th to 7th orders are coded into 5-bit data, and the other codes are coded into 9-bit data.

(Case 6) The code of the 1st order is coded into 2-bit data, the codes of the 2nd to 3rd are coded into 4-bit data, the codes of the 4th to 19th orders are coded into 7-bit data, and the other codes are coded into 9-bit data.

(Case 7) The code of the 1st order is coded into 2-bit data, the codes of the 2nd to 5th orders are coded into 5-bit data, the codes of 6th to 21st orders are coded into 7-bit data, and the other codes are coded into 9-bit data.

(Case 8) The code of the 1st order is coded into 2-bit data, the codes of the 2nd to 3rd orders are coded into 4-bit data, the codes of the 4th to 7th orders are coded into 6-bit data, the codes of the 8th to 23rd orders are coded into 8-bit data, and the other codes are coded into 9-bit data.

FIG. 16 is a diagram showing specific bit contents. For example, in the Case 1, the 1st code is coded into 1-bit data by storing a flag representing the 1st code in a 1-bit storage area of the first output data buffer. The other codes are coded into data of 9 bits in total, by storing a flag representing that the data is uncompressed in a 1-bit storage area of the first output data buffer, and further storing the original input data (8 bits) in a storage area of the eighth output data buffer. Also in the Case 2 to Case 8, the coding is performed as shown in FIG. 16.

FIGS. 17 show examples of the compression format 113 which the compression efficiency determination unit 39 determines to output based on the calculation results. FIG. 17A corresponds to the Case 1, FIG. 17B to the Case 2, FIG. 17C to the Case 3, FIG. 17D to the Case 4, FIG. 17E to the Case 5, FIG. 17F to the Case 6, FIG. 17G to the Case 7, and FIG. 17H to the Case 8. For example, in case of image data that includes much image information having the same color, the compression efficiency determination unit 39 can select the compression format 113 that has an appropriate size corresponding to the characteristic of the input data.

Consequently, according to the present embodiment, the compression can be performed by selecting an output format having the highest compression efficiency corresponding to the input data, and the time required for the compression process and the time required for transmission of the compressed data can be shortened, enabling a very efficient output compression process to be performed.

Embodiment 7

Figure 18:
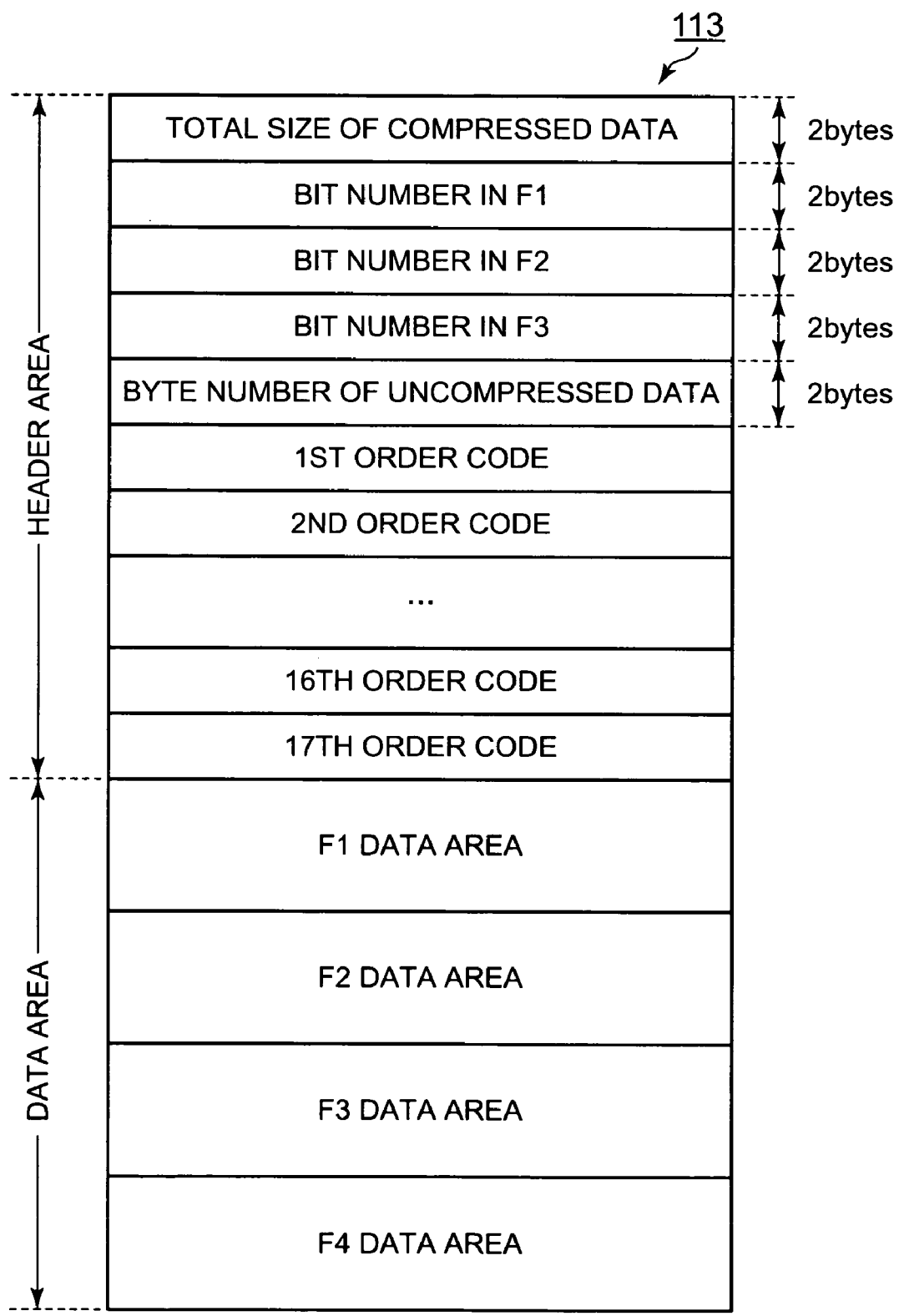
FIG. 18 is a diagram showing the structure of a compression format according to an embodiment 7.

Next, the embodiment 7 of the present invention will be explained. The present embodiment is a developed version of the output format of the Case 4 determined by the foregoing compression efficiency determination unit 39. Further, the present embodiment concerns a case where appearance frequency data regarding character codes of the 1st to 17th orders are generated by the preparatory process unit 35, where the compression format 113 has the structure shown in FIG. 18. As shown in FIG. 18, the compression format 113 is formed of a header area and a data area. The total compression size of the coded data, the bit numbers of F1 to F3 data areas, the byte number of uncompressed data, and the character codes of the 1st to 17th orders are stored in the header area. The data area includes an F1 data area and F2 data area which are set by a later-described 12th–17th order common coding process, an F3 data area to be set by later-described 17th order coding process and appearance frequency process, and an F4 data area to be set by a later-described data un-compressing process.

Figure 19:
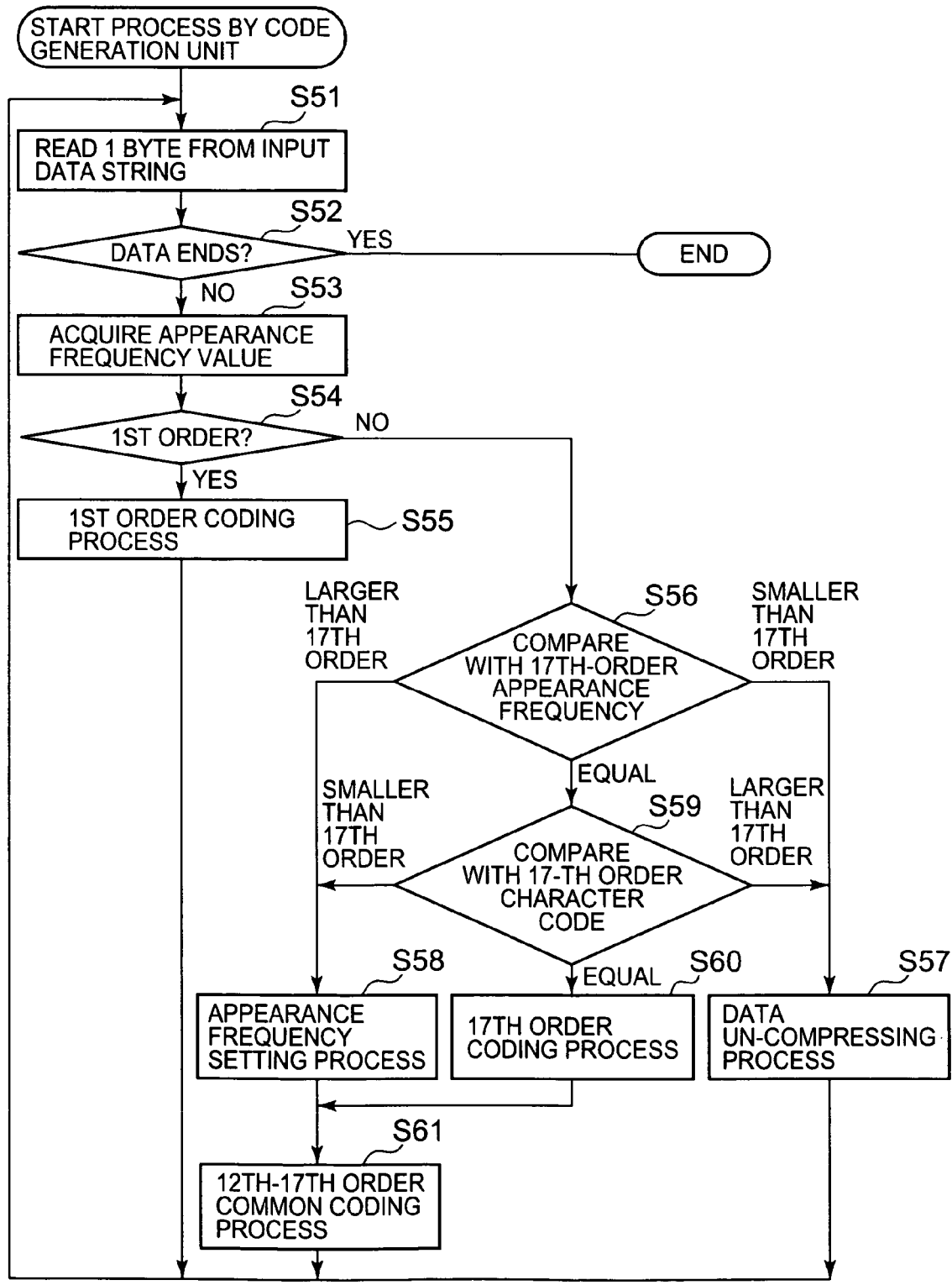
FIG. 19 is a flowchart showing a process performed by a code generation unit.

FIG. 19 is a flowchart showing a process performed by the code generation unit 36 according to the present embodiment.

First, the code generation unit 36 reads 1 byte of data from the input data supplied in the input data buffer 30 (step S51). The code generation unit 36 determines whether the read 1-byte data is the last data of the input data (step S52). For example, if the process of this step is performed for the first time, the input data includes a sufficiently large amount of data. In a case where it is not the last data of the input data (step S52; NO), the code generation unit 36 acquires the information on the appearance frequency of the read 1-byte data (step S53). The code generation unit 36 searches the first output data buffer, and determines whether the read 1-byte data corresponds to the character code of the 1st order in the order of appearance frequency (step S54).

In a case where the read 1-byte data corresponds to the code of the 1st order (step S54; YES), the code generation unit 36 performs a 1st order coding process (step S55). Specifically, the code generation unit 36 turns on the bit in the first output data buffer, and turns off the bit in the second output data buffer.

In a case where the read 1-byte data does not correspond to the code of the 1st order (step S54; NO), the code generation unit 36 compares the read data with the character code of the 17th order (step S56). If the appearance frequency of the read data is smaller than that of the code of the 17th order, the code generation unit 36 performs a data un-compressing process (step S57). Specifically, the code generation unit 36 turns off the bit in the first output data buffer, and sets the read data in the fourth output data buffer.

To the contrary, if the appearance frequency of the read data is larger than that of the character code of the 17th order, the code generation unit 36 performs an appearance frequency setting process (step S58). Specifically, the code generation unit 36 performs, for example, a binary search on the 12th to 16th data in the code table 112, and sets the order of the character code that is searched out as corresponding to the read data in the third output data buffer.

If the appearance frequency of the read data is equal to that of the character code of the 17th order, the code generation unit 36 compares the read 1-byte data with the character code of the 17th order (step S59). If they correspond to each other, the code generation unit 36 performs a 17th order coding process (step S60). Specifically, the code generation unit 36 sets the value of the character code of the 17th order in the third output data buffer. Then, the code generation unit 36 performs a 12th–17th order common coding process (step S61). Specifically, the code generation unit 36 turns on the bit in the first output data buffer, and turns on the bit in the second output data buffer. Then, the coded data output process unit 37 outputs the data stored in the first to fourth output data buffers based on the compression format 113.

As described above, according to the present embodiment, the compression can be performed by selecting an output format that have the most appropriate compression efficiency for the input data, and the time required for the compression and the time required for transmission of the compressed data can be shortened. The present embodiment has been explained by employing an example where the appearance frequency ranges from 1st to 17th orders. However, the appearance frequency may range from 1st to 23rd orders, or may range to other ordinal numbers.

Embodiment 8

Next, the embodiment 8 of the present invention will be explained.

Figure 20:
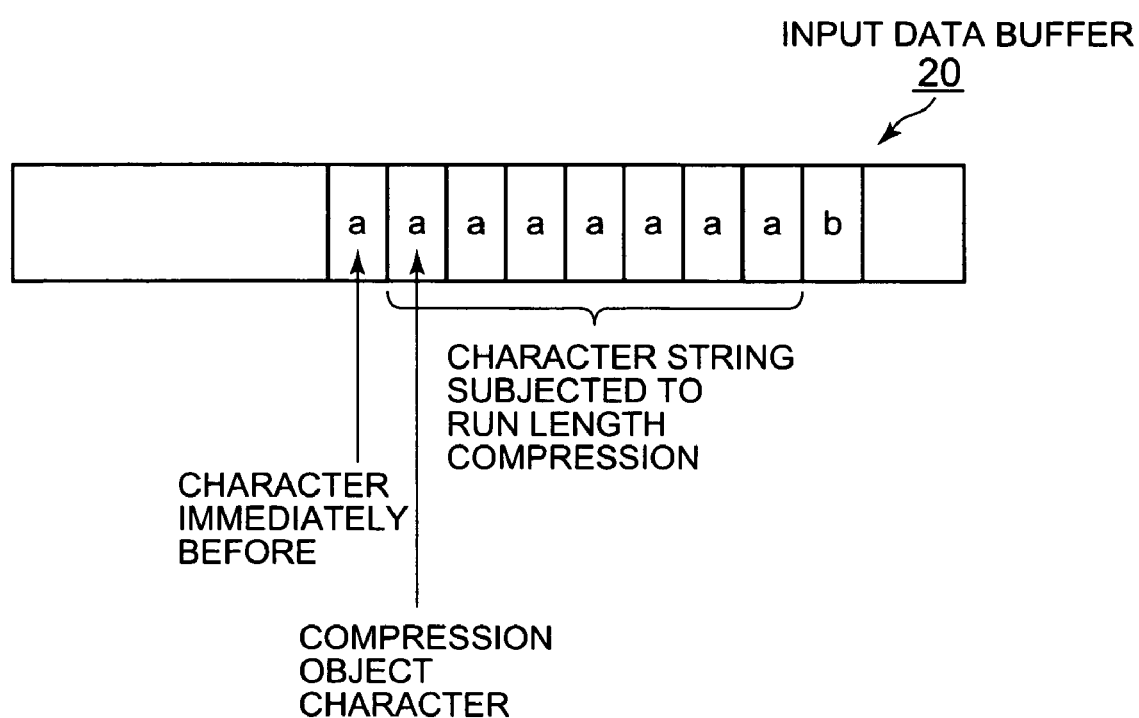
FIG. 20 is a diagram for explaining a data compression process according to an embodiment 8.

FIG. 20 is a diagram for explaining the compression process of the present embodiment. The compression process of the present embodiment can be applied to the foregoing embodiments. For example, in a case where it is applied to the embodiment 1, before the search for the longest corresponding character string is carried out, determination is made whether a character same as a character immediately before it continuously appears. In a case where a same character continuously appears, the first compression unit 1 performs a run length compression process. For example, FIG. 20 shows a case where a character "a" continuously appears eight times. According to an ordinary run length compression process, the compressed data is represented by a flag indicative of compression/un-compression, length, and the continuously appearing character data. In contrast, according to the present embodiment, the compressed data is represented only by a flag indicative of compression/un-compression and length. This flag serves also as the reference to the longest corresponding character string. Identification information for the run length compression is stored in the storage position for the correspondence start position of the longest corresponding character string.

For example, in a case where image data includes many white portions, the same value continuously appears in these portions. Therefore, by adding the run length compression process of the present embodiment for compressing such input data, it is possible to improve the compression efficiency.

Embodiment 9

Next, the embodiment 9 of the present invention will be explained.

Figure 21:
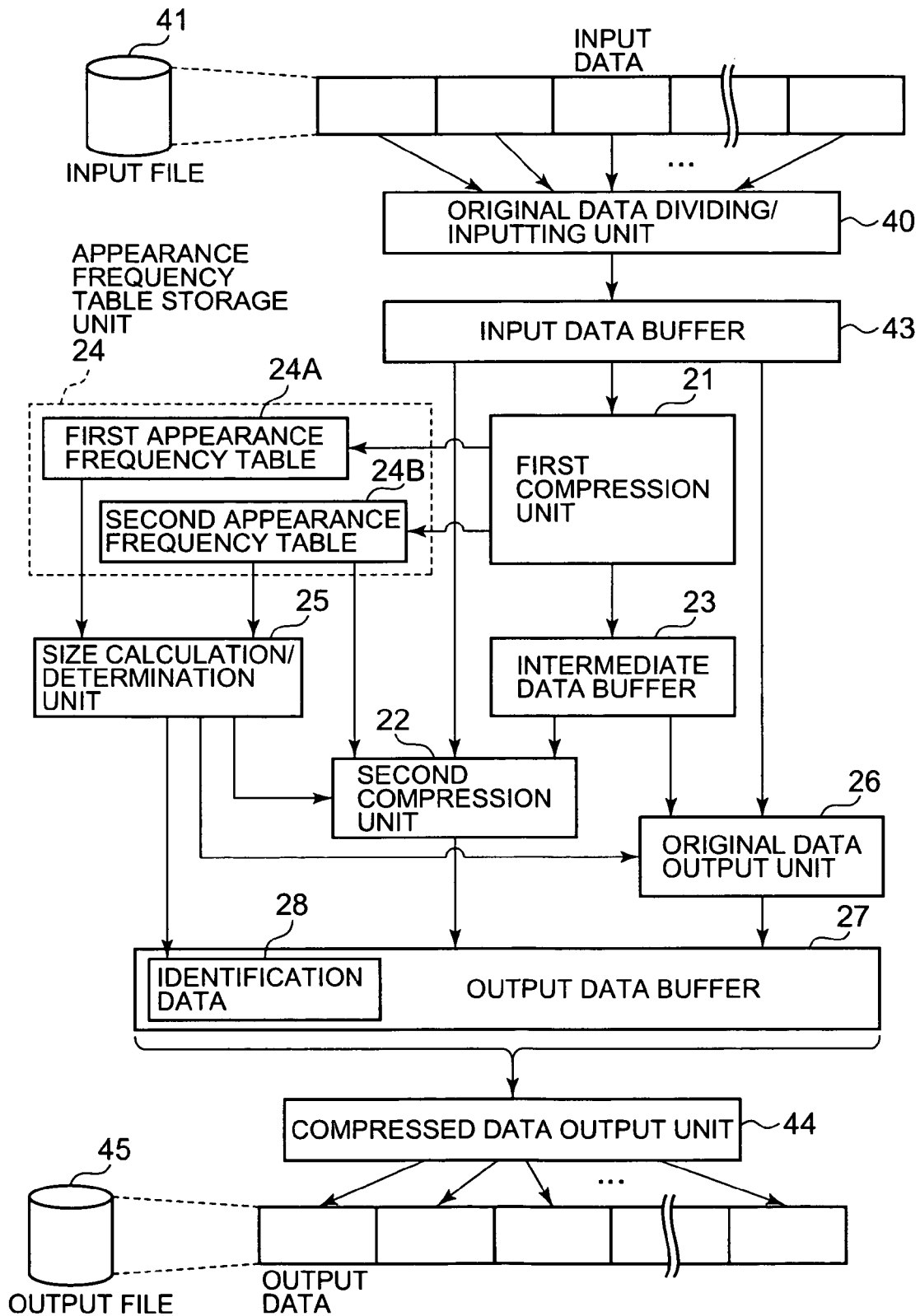
FIG. 21 is a diagram for explaining the structure of a data compression device according to an embodiment 9.

FIG. 21 is a diagram for explaining the present embodiment. According to the present embodiment, in order to deal with coding of input data of a great amount, the compression device comprises an original data dividing/inputting unit 40 for dividedly controlling the input data. The original data dividing/inputting unit 40 divides the input data stored in an input file 41 and outputs them to an input data buffer 43. Then, likewise the foregoing embodiments, the input data input to the input data buffer 43 is subjected to the first compression process by the first compression unit 21, and then to the second compression process by the second compression unit 22.

With this structure, the input data is dividedly supplied to the input data buffer 43, enabling input data of a great amount to be easily processed.

The other components shown in FIG. 21 are the same as those shown in FIG. 7, and explanation for them is therefore omitted. Then, the compressed data stored in the output data buffer 27 is sequentially output to an output file 45 from a compressed data output unit 44.

For example, the original data dividing/inputting unit 40 and the compressed data output unit 44 are comprised in the control unit 101. The input data buffer 43 is comprised in the RAM 103. Or, these may be structured as circuits for performing the above-described processes.

Embodiment 10

Next, the embodiment 10 of the present invention will be explained.

The embodiments 1 to 9 have explained the process for compressing input data. The present embodiment will explain the process for decompressing the compressed data generated by the above-described compression processes. The decompression process will now be specifically explained.

Figure 22:
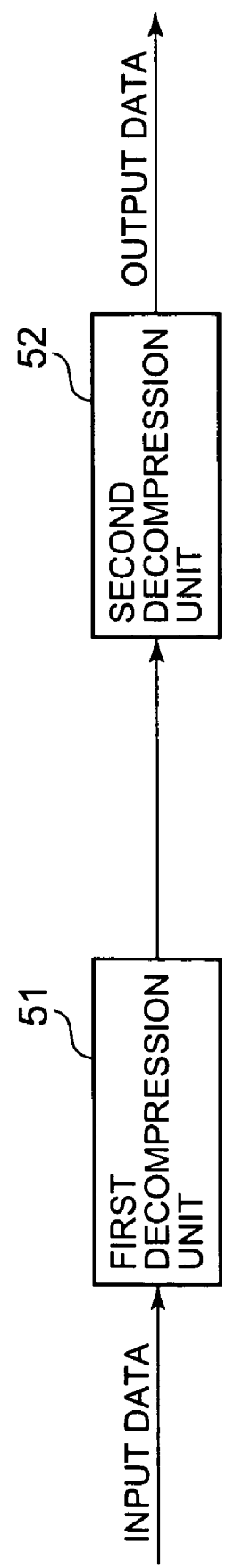
FIG. 22 is a diagram for explaining the structure of a data decompression device according to an embodiment 10.

With reference to FIG. 22, a first decompression unit 51 performs a process for decoding data coded by a semi-adaptive statistical coding method, and a second decompression unit 52 performs a process for decoding data coded by an adaptive dictionary coding method. With this configuration, a process for decompressing data compressed in accordance with the aforementioned embodiments 1 to 9 will be performed.

The compressed data generated according to the embodiments 1 to 9 is input to the first decompression unit 51 as input data, so that the compressed data generated by the aforementioned second compression unit 12 or 22 will be decompressed. The second decompression unit 52 decompresses the compressed data generated by the aforementioned first compression unit 11 or 21.

The first decompression unit 51 and the second decompression unit 52 are comprised in the control unit 101. Or, these may be structured as circuits for performing the above-described processes.

With this configuration, decoding is performed reversibly, and a decoding process corresponding to the compression process can be performed.

Embodiment 11

Next, the embodiment 11 of the present invention will be explained.

The present embodiment will also explain a decoding process. The decoding process will now be specifically explained.

Figure 23:
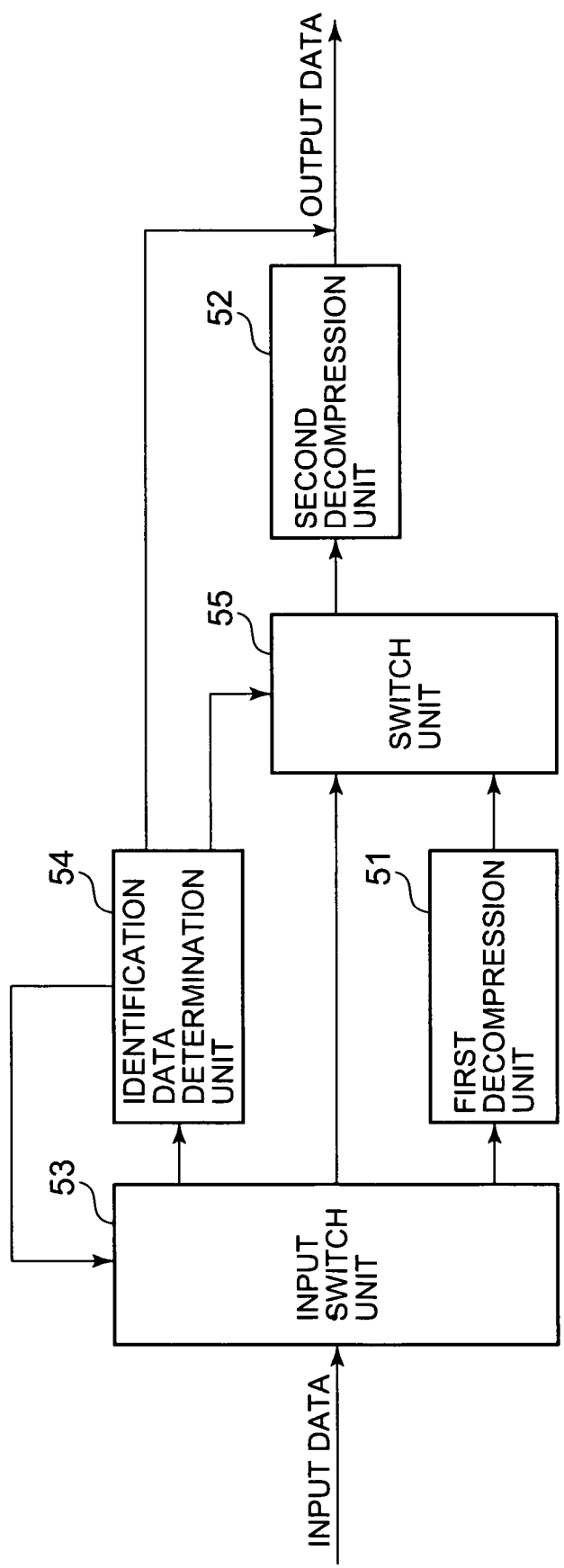
FIG. 23 is a diagram for explaining the structure of a data decompression device according to an embodiment 11.

FIG. 23 is a diagram for explaining the structure of a data decompression device according to the present embodiment. In FIG. 23, the first decompression unit 51 performs a process for decompressing data coded by a semi-adaptive statistical coding method, and the second decompression unit 52 performs a process for decompressing data coded by an adaptive dictionary coding method, likewise the foregoing embodiment. An input switch unit 53 acquires (compressed) input data having been coded in accordance with the process of the embodiment 3, and passes the acquired data to any of an identification data determination unit 54, the first decompression unit 51, and the second decompression unit 52. Note that in an initialized state, the input switch unit 53 is set to pass the input data to the identification data determination unit 54.

Identification data 28 used in the present embodiment is the same as that explained in the embodiment 3. The identification data determination unit 54 determines where to supply the received input data, based on the identification data 28. The input switch unit 53 supplies the input data based on the determination result.

For example, in a case where the value of the identification data 28 is "1", the input switch unit 53 supplies the input data to the second decompression unit 52 via a switch unit 55. Then, the second decompression unit starts the decompression process.

In a case where the value of the identification data 28 is "2", the input switch unit 53 supplies the input data to the first decompression unit 51. Furthermore, the identification data determination unit 54 controls the switch unit 55 so that the output data from the first decompression unit 51 will be supplied to the second decompression unit 52. The first decompression unit 51 starts the decompression process. The second decompression unit 52 starts the decompression process by using the data input from the first decompression unit 51.

The input switch unit 53, the identification data determination unit 54, and the switch unit 55 are comprised in the control unit 101. Or, these may be structured as circuits for performing the above-described processes.

Thus, according to the present embodiment, the decompression process can be performed based on the value of the identification data 28 that is set at the time of compression, enabling decompression of compressed data to be performed efficiently by using a decompression method corresponding to the compression method.

Embodiment 12

Next, the embodiment 12 of the present invention will be explained.

The present invention will also explain a data decompression process. The process will now be specifically explained.

Figure 24:
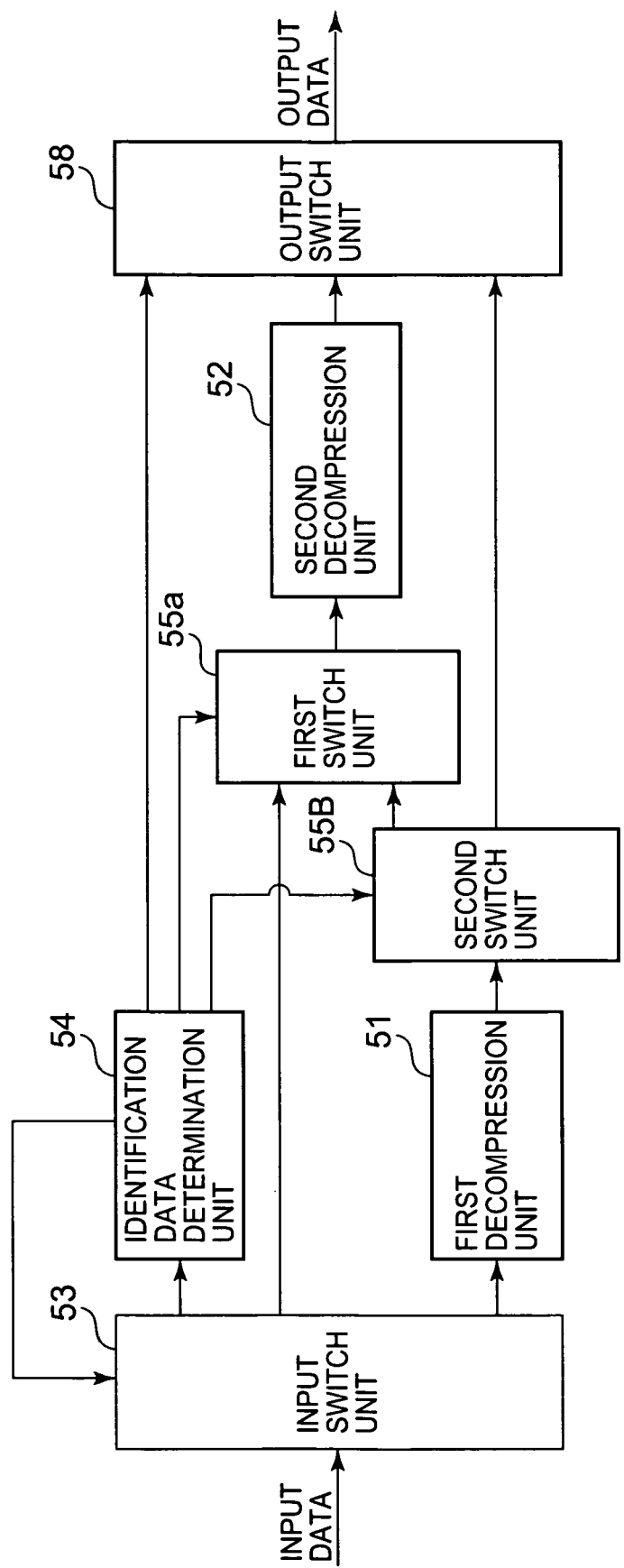
FIG. 24 is a diagram for explaining the structure of a data decompression device according to an embodiment 12.

FIG. 24 is a diagram for explaining the structure of a data decompression device according to the present embodiment. In FIG. 24, the first decompression unit 51 performs a process for decompressing data coded by a semi-adaptive statistical coding method, and the second decompression unit 52 performs a process for decompressing data coded by an adaptive dictionary coding method, likewise the above-described embodiment. In FIG. 24, the input switch unit 53 and the identification data determination unit 54 are the same as those in the foregoing embodiment. However, the identification data determination unit 54 identifies four kinds of values of the identification data 28 to be described later. The present embodiment is adapted to decompress compressed data generated by the compression device of the embodiment 4.

According to the present embodiment, the data decompression device further comprises a first switch unit 55A, a second switch unit 55B, and an output switch unit 58.

In a case where the value of the identification data 28 input to the identification data determination unit 54 is "1", the identification data determination unit 54 eliminates the determined identification data 28, and outputs the remaining input data to the output switch unit 58 to the end of the data.

In a case where the value of the identification data 28 is "2", the identification data determination unit 54 controls the input switch unit 53 and the first switch unit 55A so that the input data will be supplied to the second decompression unit 52. The second decompression unit 52 outputs the output data to the output switch unit 58. Thus, through this process, the input data is decompressed by the second decompression unit 52, and the output switch unit 58 outputs data decompressed by the second decompression unit 52.

In a case where the value of the identification data 28 is "3", the identification data determination unit 54 controls the input switch unit 53 so that the input data will be supplied to the first decompression unit 51. The first decompression unit 51 decompresses the input data. Further, the identification data determination unit 54 controls the second switch unit 55B so that the output data from the first decompression unit 51 will be input to the output switch unit 58. Therefore, by this control, the first decompression unit 51 decompresses the input data, and the output switch unit 58 outputs the data decompressed by the first decompression unit 51.

In a case where the value of the identification data 28 is "4", the identification data determination unit 54 controls the input switch unit 53, the first switch unit 55A, the second switch unit 55B, and the output switch unit 58 so that the data decompressed by the first decompression unit 51 will be decompressed by the second decompression unit 52. The first decompression unit 51 and the second decompression unit 52 perform the decompression process. To be more specific, the first decompression unit 51 decompresses the input data, and inputs the obtained decompressed data to the second decompression unit 52. The second decompression unit 52 further decompresses the data input from the first decompression unit 51. The output switch unit 58 outputs decompressed data having been decompressed both by the first and second decompression units 51 and 52.

In a case where the value of the identification data 28 is other than "1" to "4", the identification data determination unit 54 outputs the input data including the determined identification data to the output switch unit 58 with no treatment added. Alternatively, in this case, the decompression device may be arranged to output an "error" response.

The first switch unit 55A, the second switch unit 55B, and the output switch unit 58 are comprised in the control unit 101. Or, these units may be structured as circuits for performing the above-described processes.

With this process, the decompression process can be performed based on the value of the identification data 28 set at the time of data compression, enabling the decompression process to be performed efficiently by selecting an appropriate decompression method corresponding to the coding method.

Embodiment 13

Next, the embodiment 13 of the present invention will be explained.

The present embodiment will also explain a data decompression process. The present embodiment is directed to decompress data that is compressed by the statistical coding method of the foregoing embodiments 5 to 7. This process will now be specifically explained.

Figure 25:
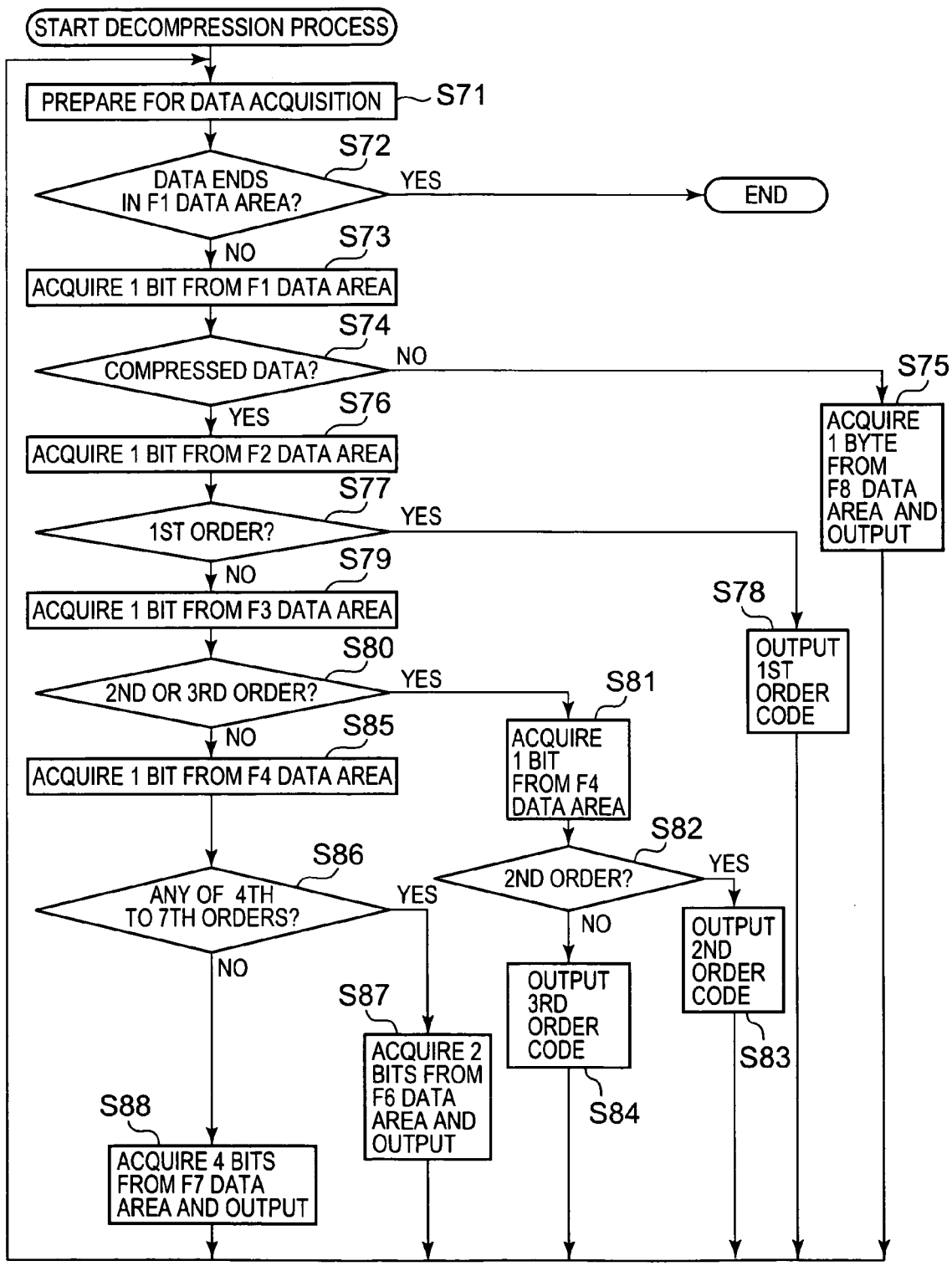
FIG. 25 is a flowchart for explaining a data decompression process performed by a data decompression device according to an embodiment 13.

FIG. 25 is a flowchart showing a decompression algorithm of a decompression process performed by the first or the second decompression unit 51 or 52 (hereinafter referred to as "decompression unit").

First, the decompression unit prepares for acquiring data from the F1 to F8 data areas (step S71). Specifically, for example, the decompression unit acquires the coded input data, and checks whether the acquired data is formatted based on the compression format 113. If the input data is not based on the compression format 113, the decompression unit may be designed to terminate the decompression process.

Next, the decompression unit determines whether the data in the F1 data area ends or not (step S72). If data still exists (step S72; NO), the decompression unit acquires 1-bit data from the F1 data area (step S73). Further, the decompression unit determines whether the acquired 1-bit data indicates that the data is uncompressed or compressed (step S74).

In a case where the 1-bit data indicates that the data is uncompressed (step S74; NO), the decompression unit acquires 1-byte data from the F8 data area and outputs the acquired 1-byte data (step S75).

To the contrary, in a case where the acquired 1-bit data indicates that the data is compressed (step S74; YES), the decompression unit acquires 1-bit data from the F2 data area (step S76). Then, the decompression unit determines whether the acquired 1-bit data indicates that the data is the data of the 1st order in the order of appearance frequency (step S77). In a case where the 1-bit data indicates that the data is the data of the 1st order (step S77; YES), the decompression unit refers to the character code of the 1st order and outputs the code of the 1st order (step S78).

In a case where the acquired 1-bit data does not indicate that the data is the data of the 1st order (step S77; NO), the decompression unit acquires 1-bit data from the F3 data area (step S79). The decompression unit determines whether the 1-bit data indicates or does not indicate that the data is any of the two codes that are the next highest in the order of appearance frequency, that is, the data is the data of the 2nd or the 3rd order (step S80).

In a case where the acquired 1-bit data indicates that the data is the code of the 2nd or the 3rd order in the order of appearance frequency (step S80; YES), the decompression unit acquires 1-bit data from the F4 data area (step S81). The decompression unit further determines whether the acquired 1-bit data indicates that the data is the code of the 2nd order or indicates that the data is the code of the 3rd order (step S82). In a case where the data is the code of the 2nd order (step S82; YES), the decompression unit refers to the code table 112 and outputs the code of the 2nd order (step S83). To the contrary, in a case where the data is the code of the 3rd order (step S82; NO), the decompression unit outputs the code of the 3rd order (step S84).

On the other hand, in a case where the data is neither the data of the 2nd order nor the 3rd order at step S80 (step S80; NO), the decompression unit acquires 1-bit data from the F4 data area (step S85). The decompression unit determines whether the acquired 1-bit data indicates that the data is any of the four codes that are the further next highest in the order of appearance frequency, i.e., the data is any of the codes of the 4th to the 7th orders (step S86). In a case where the data is any of the codes of the 4th to the 7th orders (step S86; YES), the decompression unit acquires 2-bit data from the F6 data area, and outputs the character code data of the 4th, 5th, 6th, or the 7th order that is indicated by the acquired 2-bit data (step S87).

To the contrary, in a case where the data is none of the codes of the 4th to the 7th orders (step S86; NO), the decompression unit acquires 4-bit data from the F7 data area, and outputs any of the character codes of the 8th to the 23rd orders that is indicated by the acquired 4-bit data (step S88).

By performing the decompression process in the above-described manner, it is possible to decompress data having been compressed by the statistical coding method, and to perform a decompression process corresponding to the compression process.

Embodiment 14

Next, the embodiment 14 of the present invention will be explained.

The present invention will also explain a data decompression process. The present invention is adapted to the above-described embodiment 9.

Figure 26:
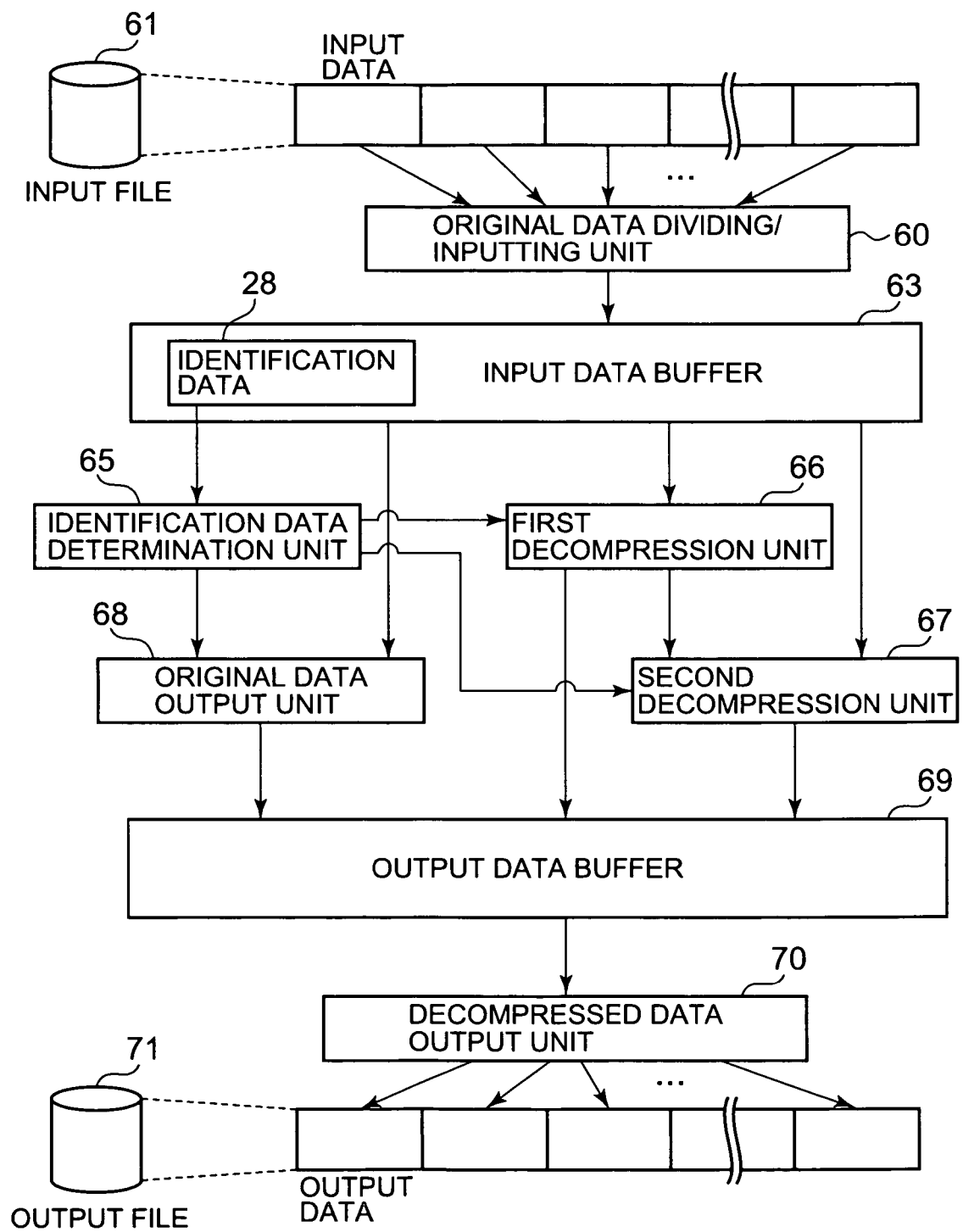
FIG. 26 is a diagram for explaining the structure of a data decompression device according to an embodiment 14.

FIG. 26 is a diagram for explaining the structure of a data decompression device according to the present embodiment. The present embodiment will explain a process for decompressing compressed data generated by the compression process where input data of a great amount is divided before compression. In FIG. 26, an original data dividing/inputting unit 60 divides the input data stored in an input file 61, and outputs the divided data to an input data buffer 63. The compressed data is divided and supplied to the input data buffer 63. Then, an identification data determination unit 65 selects a first decompression unit 66, a second decompression unit 67, or an original data output unit 68 based on the value of the identification data 28, and controls the process of decompressing the compressed data.

The data decompressed by the decompression process of the present embodiment is output to an output data buffer 69. The data input to the output data buffer 69 is taken out by a decompressed data output unit 70 and sequentially output to an output file 71.

The original data dividing/inputting unit 60, the identification data determination unit 65, the first decompression unit 66, the second decompression unit 67, the original data output unit 68, and the decompressed data output unit 70 are comprised in the control unit 101. The input data buffer 63 and the output data buffer 69 are comprised in the RAM 103. Or, these units may be structured as circuits for performing the above-described processes.

By performing a decompression process in the above-described manner, it is possible to decompress and output compressed data having a great amount.

Embodiment 15

Next, the embodiment 15 will be explained.

Figure 27:
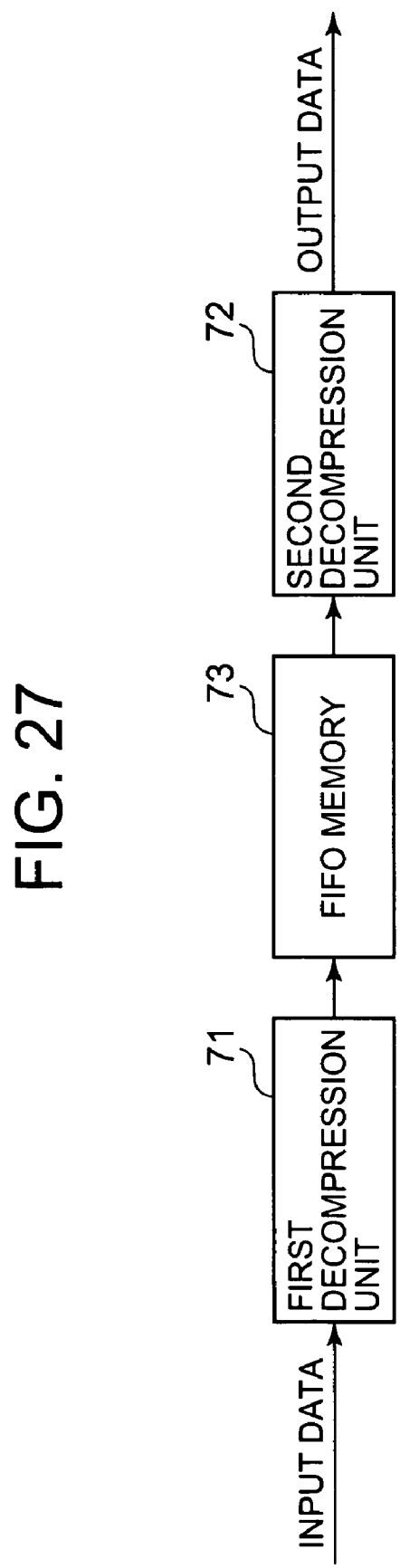
FIG. 27 is a diagram for explaining the structure of a data decompression device according to an embodiment 15.
Figure 28:
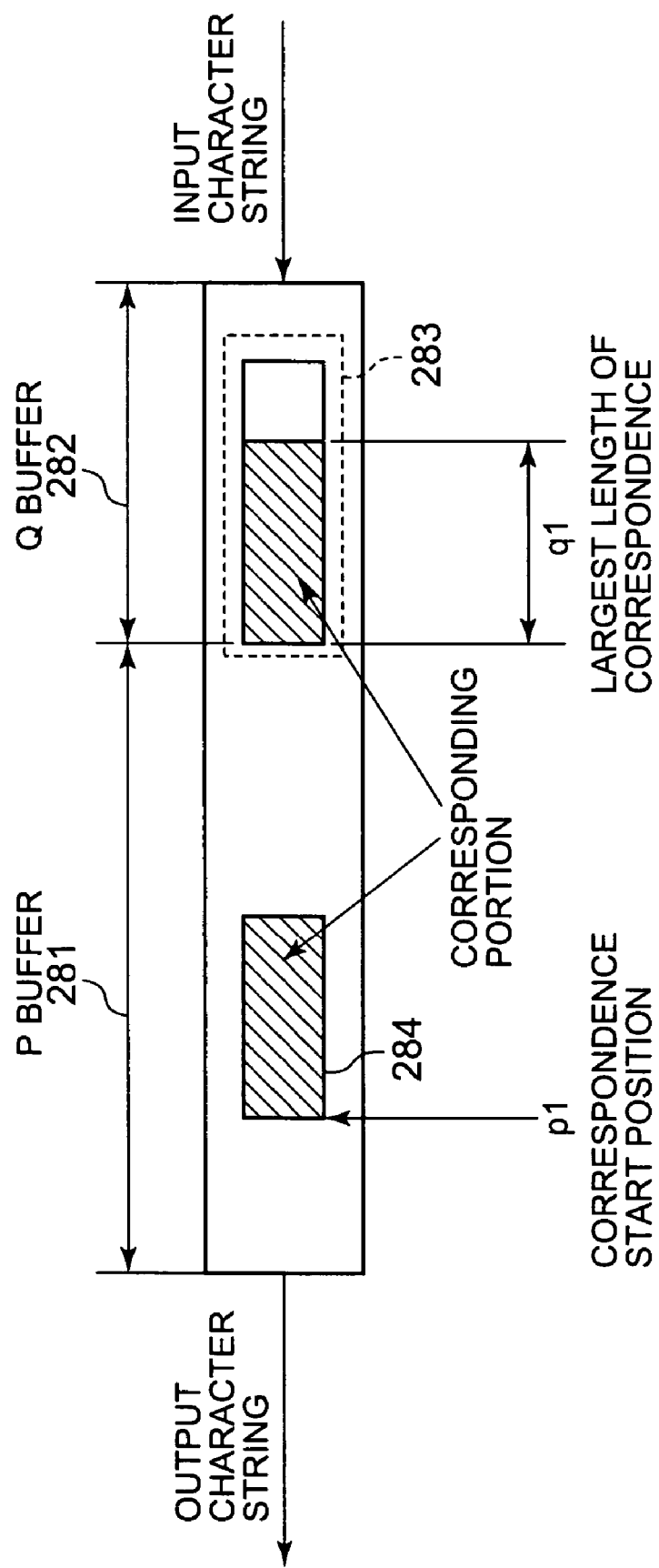
FIG. 28 is a diagram for explaining an earlier data compression process.
Figure 29:
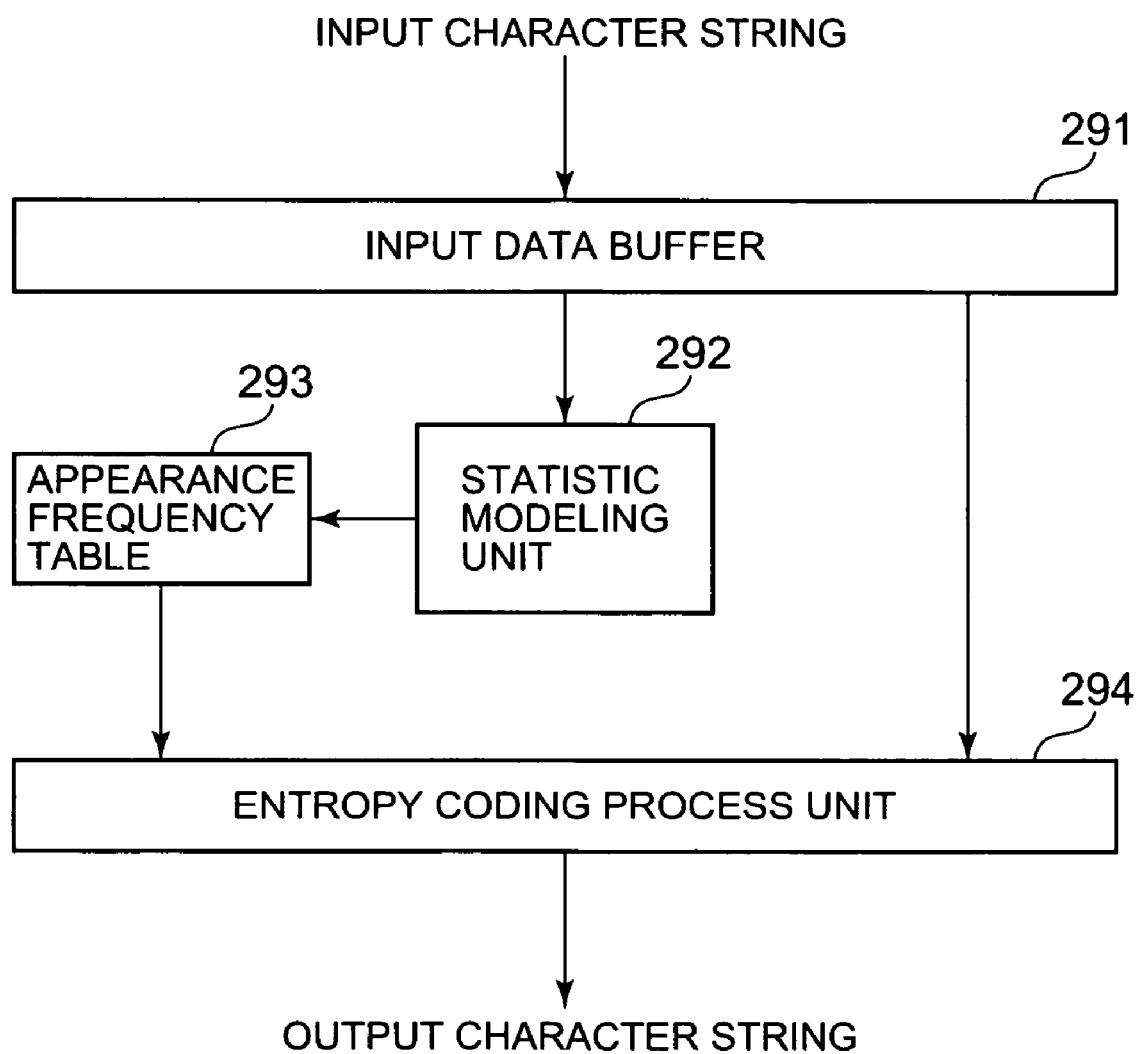
FIG. 29 is a diagram for explaining an earlier data compression process.

The present embodiment is a modification of the decompression process of the embodiment 10. FIG. 27 shows the structure of a data decompression device according to the present embodiment. In FIG. 27, a first decompression unit 71 performs a process for decompressing data coded by a semi-adaptive statistical coding method, and a second decompression unit 72 performs a process for decompressing data coded by an adaptive dictionary coding method. In addition, the data decompression device is mounted with a FIFO (first-in first-out) memory 73. The first decompression unit 71 inputs decompressed data of 1 byte in the FIFO memory 73 when it decompresses compressed data of 1 byte. Then, the 1-byte decompressed data is output from the FIFO memory 73 to the second decompression unit 72. The second decompression unit 72 further decompresses the input data.

Hence, according to the present embodiment, the first decompression process and the second decompression process can be performed in parallel, contributing to the acceleration of the data decompression.

Various embodiments and changes may be made thereunto without departing from the broad spirit and scope of the invention. The above-described embodiments are intended to illustrate the present invention, not to limit the scope of the present invention. The scope of the present invention is shown by the attached claims rather than the embodiments. Various modifications made within the meaning of an equivalent of the claims of the invention and within the claims are to be regarded to be in the scope of the present invention.

This application is based on Japanese Patent Application No. 2004-379814 filed on Dec. 28, 2004 and Japanese Patent Application No. 2005-39807 filed on Feb. 16, 2005 and including specification, claims, drawings and summary. The disclosures of the above Japanese Patent Applications are incorporated herein by reference in their entireties.

What is claimed is:

1. A data compression device, comprising:
a first data compression unit which performs a first data compression process for compressing input data by a dictionary coding method;
a second data compression unit which performs a second data compression process for compressing the data compressed by the first data compression unit by a statistical coding method; and
a size calculation/determination unit;
wherein the first data compression unit searches, by a prefixed search fashion, for longest partial data sequences in an already coded data sequence stored in a dictionary that match data sequences in the input data, and the first data compression unit compresses the data sequences in the input data by replacing each said sequence in the input data with data representing a position of the corresponding longest partial data sequence in the already coded data sequence and data representing a length of the corresponding longest partial data sequence;
wherein the size calculation/determination unit calculates: (i) a first amount of output data to be output when the input data is compressed only by the first compression unit, and (ii) a second amount of output data to be output when first output data obtained by the compressing of the input data by the first compression unit is further compressed by the second compression unit, and the size calculation/determination unit determines whether the second amount of output data is larger than the first amount of output data; and
wherein when the size calculation/determination unit determines that the second amount of output data is larger than the first amount of output data, the second compression unit refrains from performing the second data compression process.

2. The data compression device according to claim 1, wherein:
the first data compression unit counts an appearance frequency of same data included in the input data; and
the second data compression unit performs data compression by using a count result of the appearance frequency counted by the first data compression unit.

3. The data compression device according to claim 1, wherein:
the size calculation/determination unit further calculates a third amount of output data to be output when the input data is compressed only by the second compression unit, and the size calculation/determination unit compares the first amount of output data, the second amount of output data, the third amount of output data, and a data amount of the input data;
when the first amount of output data is the smallest, only the first compression unit performs compression;
when the second amount of output data is the smallest, both the first compression unit and the second compression unit perform compression;
when the third amount of output data is the smallest, only the second compression unit performs compression; and
when the data amount of the input data is the smallest, neither the first compression unit nor the second compression unit performs compression.

4. The data compression device according to claim 1, further comprising:
a compression efficiency determination unit which determines whether or not same character data continuously appears in the input data, and which instructs one of the first compression unit and the second compression unit to perform a run length compression process when it is determined that same character data continuously appears.

5. The data compression device according to claim 1, wherein one of the first compression unit and the second compression unit calculates a size of data after compression before performing the data compression, determines a data output pattern that will achieve a smallest size of the compressed data, and finds an output format based on a result of the determination.

6. The data compression device according to claim 5, wherein the output format includes areas set for a predetermined number of character codes that have highest frequencies of appearance among character codes included in the input data, and stores data that associates code numbers of the predetermined number of character codes with the frequencies of appearance of the predetermined number of character codes.

7. A data decompression device, comprising:
a first decompression unit which decompresses compressed data by a method corresponding to a statistical coding method;
a second decompression unit which further decompresses the data decompressed by the first decompression unit by a method corresponding to a dictionary coding method; and
a determination unit which determines identification data included in the compressed data;
wherein when the determination unit determines that the identification data is first identification data, the first decompression unit decompresses the compressed data, and the second decompression unit further decompresses the data obtained by the decompression by the first decompression unit; and
wherein when the determination unit determines that the identification data is second identification data, the first decompression unit decompresses the compressed data, and the second decompression unit does not further decompress the data obtained by the decompression by the first decompression unit.

8. The data decompression device according to claim 7, wherein when the determination unit determines that the identification data is third identification data, the second decompression unit decompresses the compressed data, and the first decompression unit does not decompress the compressed data.

9. A data compression method, comprising:
performing a first data compression process for compressing input data by a dictionary coding method, by: (i) searching, by a prefixed search fashion, for longest partial data sequences in an already coded data sequence stored in a dictionary that match data sequences of input data input data, and (ii) compressing the data sequences in the input data by replacing each said sequence in the input data with data representing a position of the corresponding longest partial data sequence in the already coded data sequence and data representing a length of the corresponding longest partial data sequence;
performing a second data compression process for compressing the data compressed by the first data compression process by a statistical coding method; and
performing size calculating/determining by: (i) calculating a first amount of output data to be output when the input data is compressed only by the first data compression process and a second amount of output data to be output when first output data obtained by compressing the input data by the first data compression process is further compressed by the second data compression process, and (ii) determining whether the second amount of output data is larger than the first amount of output data;

wherein when is determined by the size calculating/determining that the second amount of output data is larger than the first amount of output data, the second data compression process is not performed.

10. The data compression method according to claim 9, wherein:

when the first data compression process is performed, an appearance frequency of same data included in the input data is counted; and in the second ata compression process, data compression is performed by using a count result of the appearance frequency counted at the first data compression process.

11. The data compression method according to claim 10, wherein:

the size calculating/determining includes calculating a third amount of output data to be output when the input data is compressed only by the second data compression process, and comparing the first amount of output data, the second amount of output data, the third amount of output data, and a data amount of the input data;

when the first amount of output data is the smallest, compression is performed only by the first data compression process;

when the second amount of output data is the smallest, compression is performed both by the first data compression process and by the second data compression process;

when the third amount of output data is the smallest, compression is performed only by the second data compression process; and when the data amount of the input data is the smallest, compression is performed neither by the first data compression process nor by the second data compression process.

12. The data compression method according to claim 9, further comprising:

determining whether or not same character data continuously appears in the input data, and instructing a run length compression process to be performed at one of the first data compression process and the second data compression process when it is determined that same character data continuously appears.

13. The data compression method according to claim 9, wherein:

at one of the first data compression process and the second data, a size of data after compression is calculated before the data compression is performed, an output pattern that will achieve a smallest size of the compressed data is determined, and an output format is found based on a result of the determination.

14. The data compression method according to claim 13, wherein the output format includes areas set for a predetermined number of character codes that have highest frequencies of appearance among character codes included in the input data, and stores data that associates code numbers of the predetermined number of character codes with the frequencies of appearance of the predetermined number of character codes.

15. A data decompression method, comprising:

performing a first data decompression process of decompressing compressed data by a method corresponding to a statistical coding method; and performing a second data decompression process of further decompressing the data decompressed by the first data decompression process by a method corresponding to a dictionary coding method; and determining identification data included in the compressed data;

wherein when it is determined that the identification data is first identification data, the compressed data is decompressed by the first data decompression process, and the data obtained by decompressing at the first data decompression process is decompressed by the second data decompression process; and wherein when it is determined that the identification data is second identification data, the compressed data is decompressed by the first data decompression process, and the data obtained by decompressing at the first data decompression process is not further decompressed by the second data decompression process.

16. The data decompression method according to claim 15, wherein when it is determined that the identification data is third identification data, the compressed data is decompressed by the second data decompression process, and the first data decompression process is not performed.

* * * * *